United States Patent
Smith et al.

(10) Patent No.: US 8,728,409 B2
(45) Date of Patent: May 20, 2014

(54) APPARATUS AND METHOD FOR SUSPENSION WICKING OF NANOPARTICLES INTO MICROCHANNELS

(75) Inventors: Gabriel L. Smith, Ellicott City, MD (US); Sarah Salah Bedair, Bethesda, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 13/474,933

(22) Filed: May 18, 2012

(65) Prior Publication Data

US 2012/0266770 A1     Oct. 25, 2012

Related U.S. Application Data

(63) Continuation-in-part of application No. 12/751,308, filed on Mar. 31, 2010, now Pat. No. 8,234,773, which is a continuation-in-part of application No. 11/810,209, filed on Jun. 5, 2007.

(60) Provisional application No. 61/308,119, filed on Feb. 25, 2010, provisional application No. 60/810,995, filed on Jun. 5, 2006.

(51) Int. Cl.
  *G01N 15/06*     (2006.01)

(52) U.S. Cl.
  USPC ............ 422/503; 422/50; 422/68.1; 422/502; 422/82.01; 422/82.02; 29/592.1

(58) Field of Classification Search
  USPC ............ 422/50, 68.1, 502, 503, 82.01, 82.02; 29/592.1
  See application file for complete search history.

(56) References Cited

U.S. PATENT DOCUMENTS

2004/0038426 A1* 2/2004 Manalis ................. 436/514

* cited by examiner

*Primary Examiner* — Brain J Sines
(74) *Attorney, Agent, or Firm* — Lawrence E. Anderson

(57) ABSTRACT

A method of forming a device on a substrate comprising creating a depository and at least one attached capillary; the depository being of millimeter scale; providing a liquid containing particles in the range 1 nanometer to 1 millimeter; depositing into the depository the liquid containing particles which flows into at least one capillary by capillary action; evaporating the liquid such that the particles form an agglomerate beginning at the end of the at least one capillary with a substantially uniform distribution of the particles within the agglomerate; which is used to form a device. A microelectronic integrated circuit device comprising a substrate; a depository coupled to said substrate, the depository being formed by at least one wall adjacent to the substrate; at least one capillary channel coupled to at least one depository that is formed by walls adapted to be filled with a liquid (by capillary action) comprising nanoparticles.

17 Claims, 29 Drawing Sheets
(4 of 29 Drawing Sheet(s) Filed in Color)

| Materials | Reaction Compound | Heat of Reaction (kJ mol⁻¹) |
|---|---|---|
| Titanium/2 Boron | TiB$_2$ | −108 |
| 2 Nickel/Silicon | Ni$_2$Si | −48 |
| Nickel/Aluminum | NiAl | −46 |
| Palladium/Aluminum | PdAl | −92 |
| Zirconium/2 Boron | ZrB$_2$ | −108 |

Chip scale MEMS fuze packaging using exothermic nanoparticle reactions (like Ni/Al) for solder reflow providing localized heating

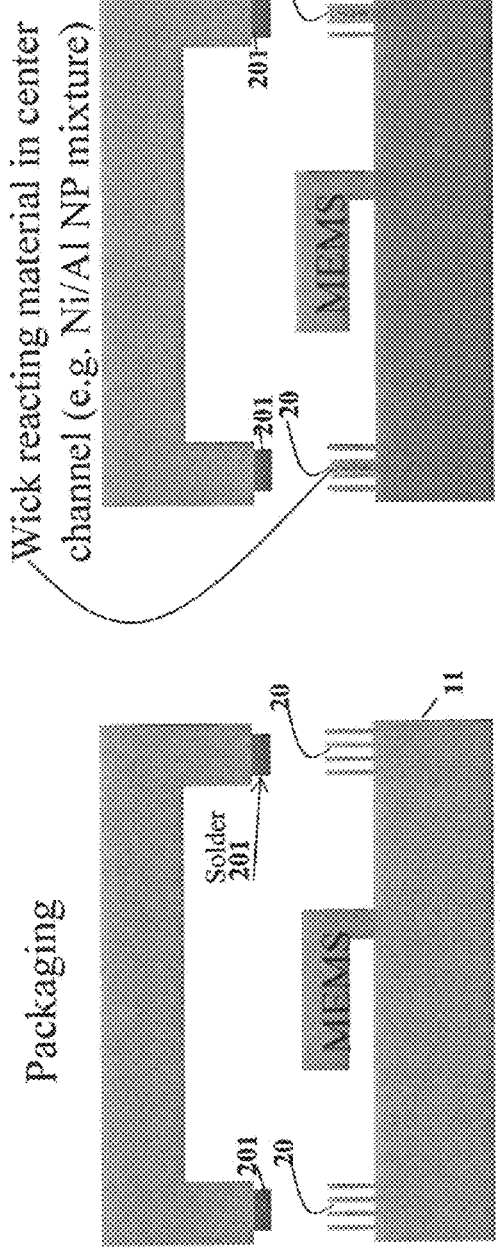
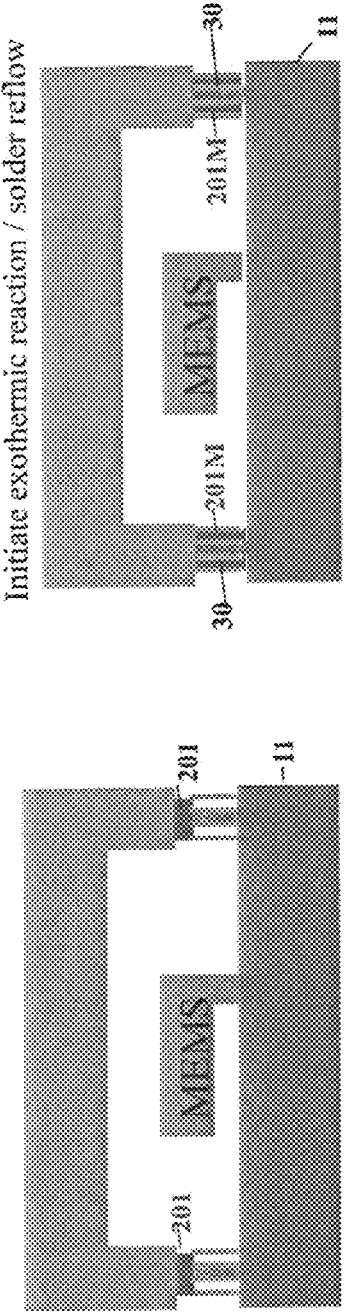

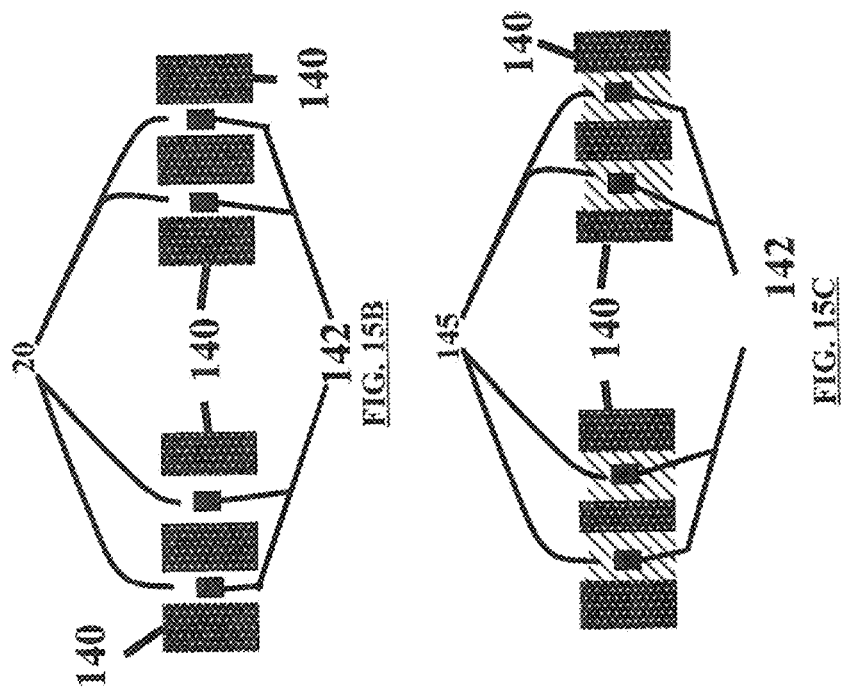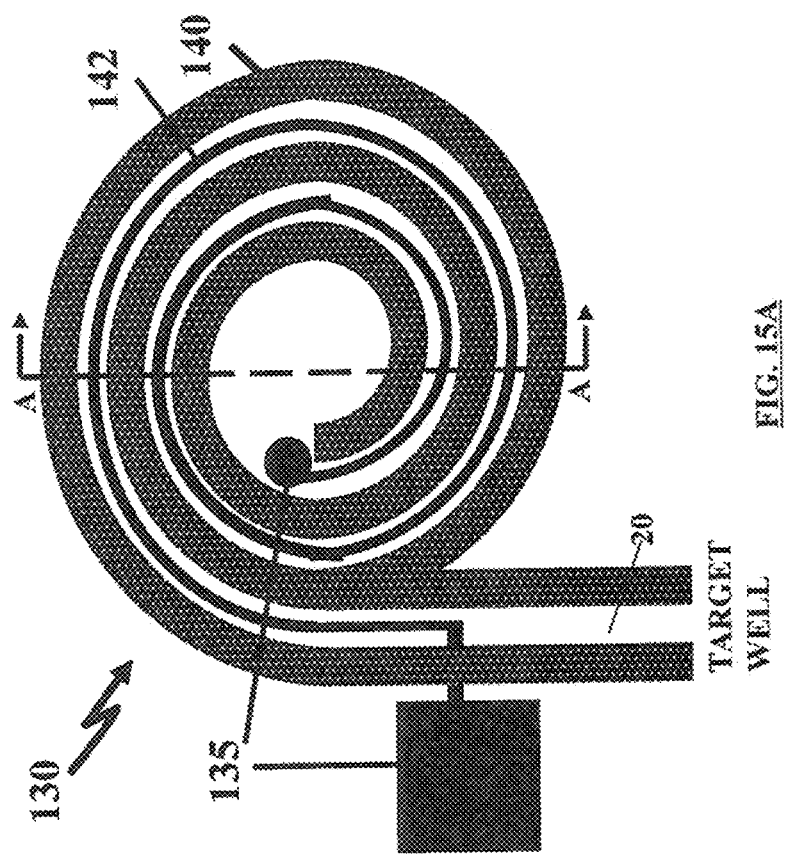

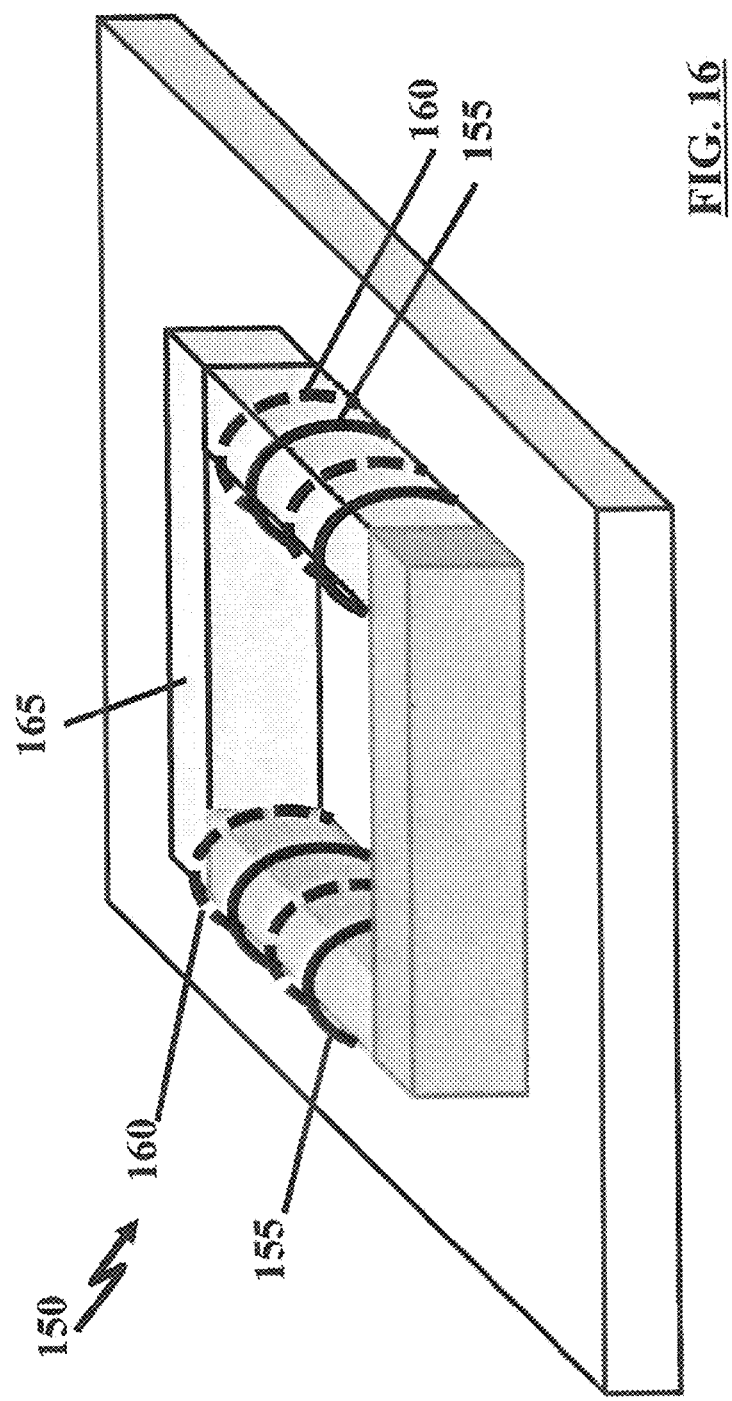

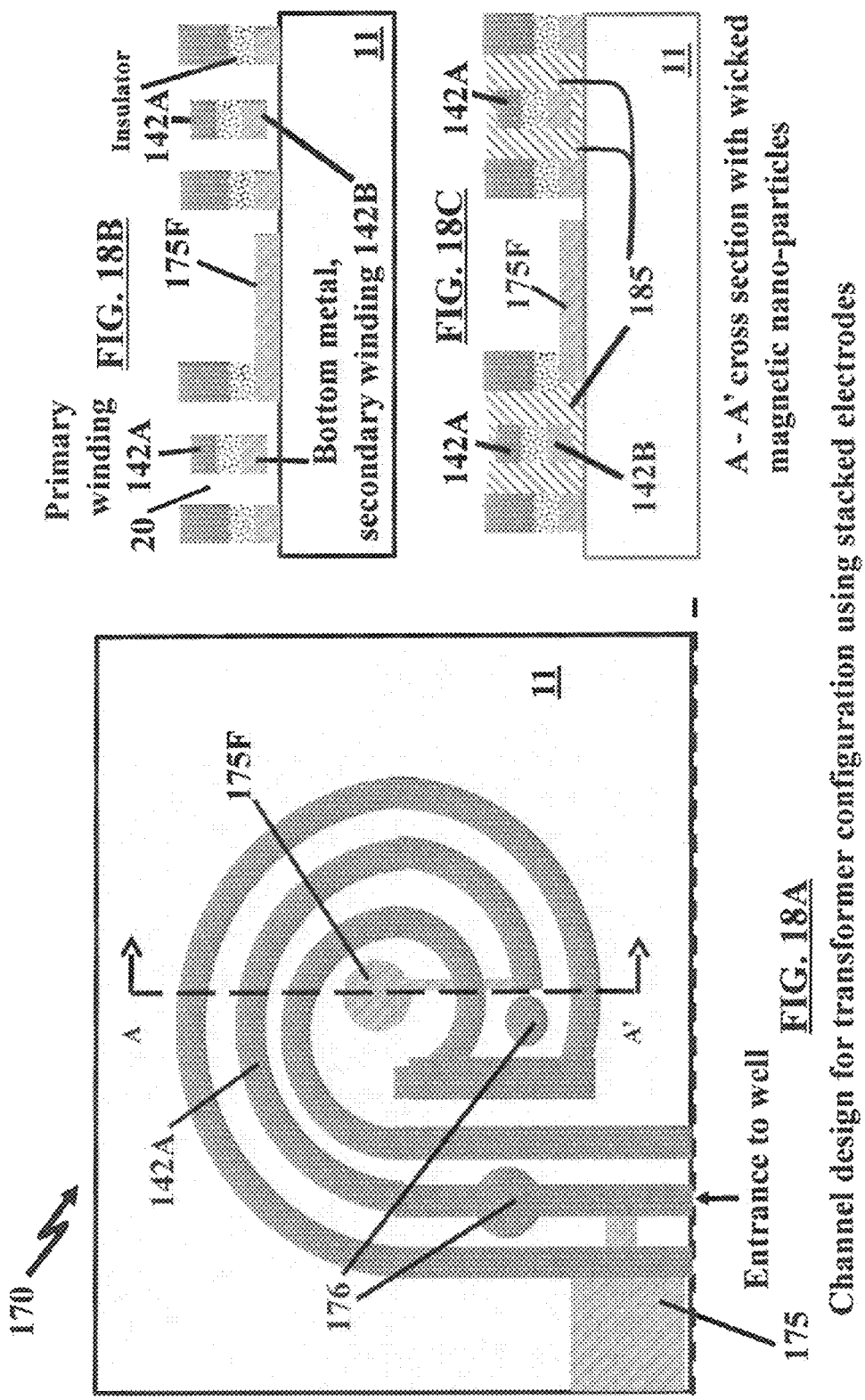

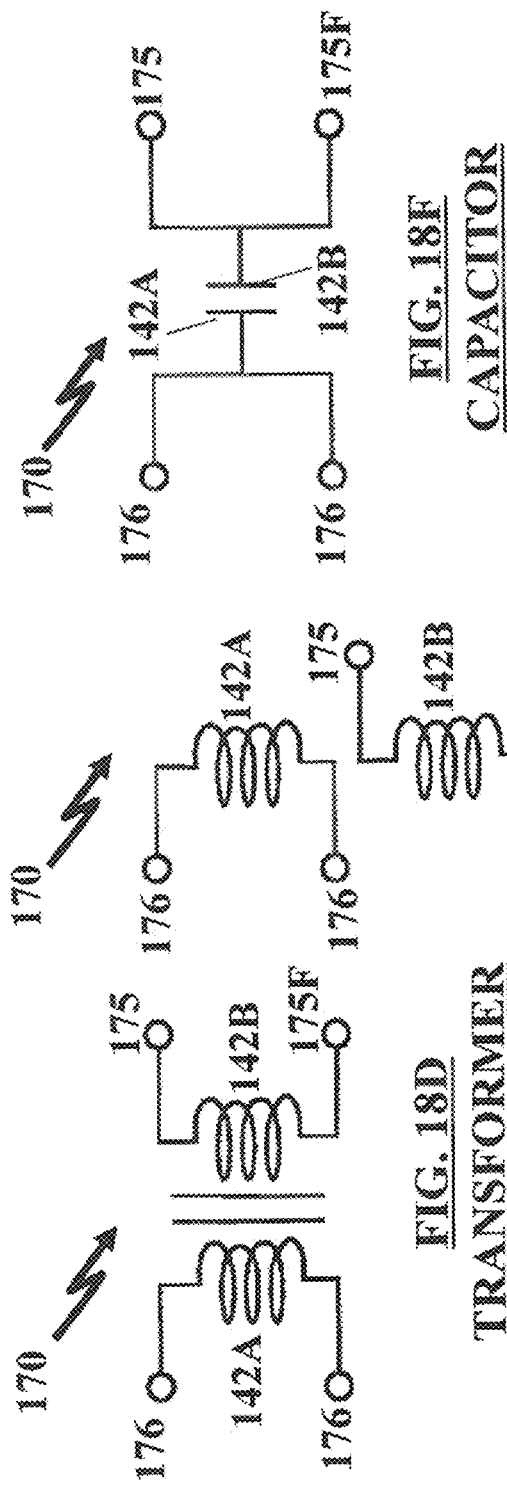

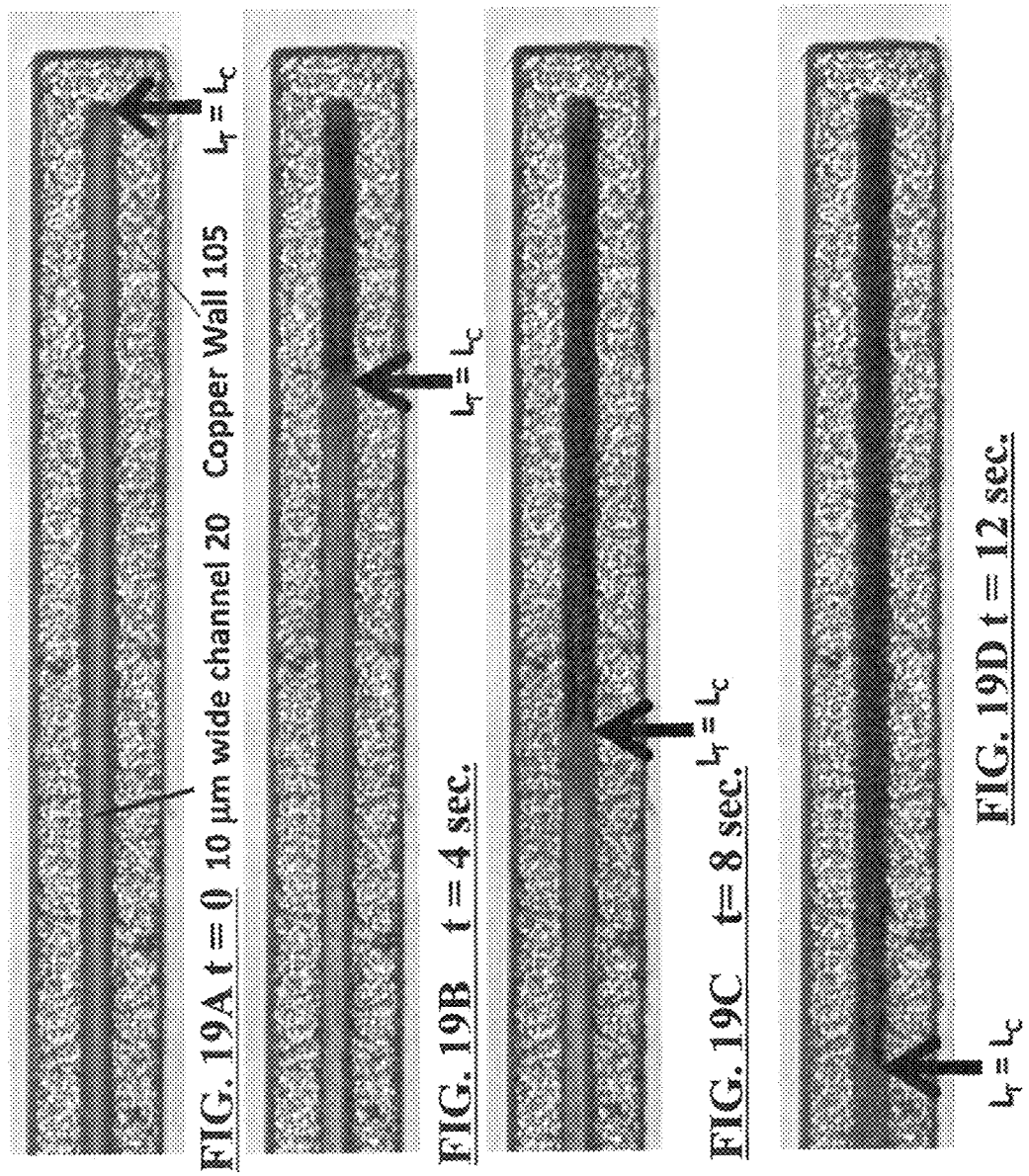

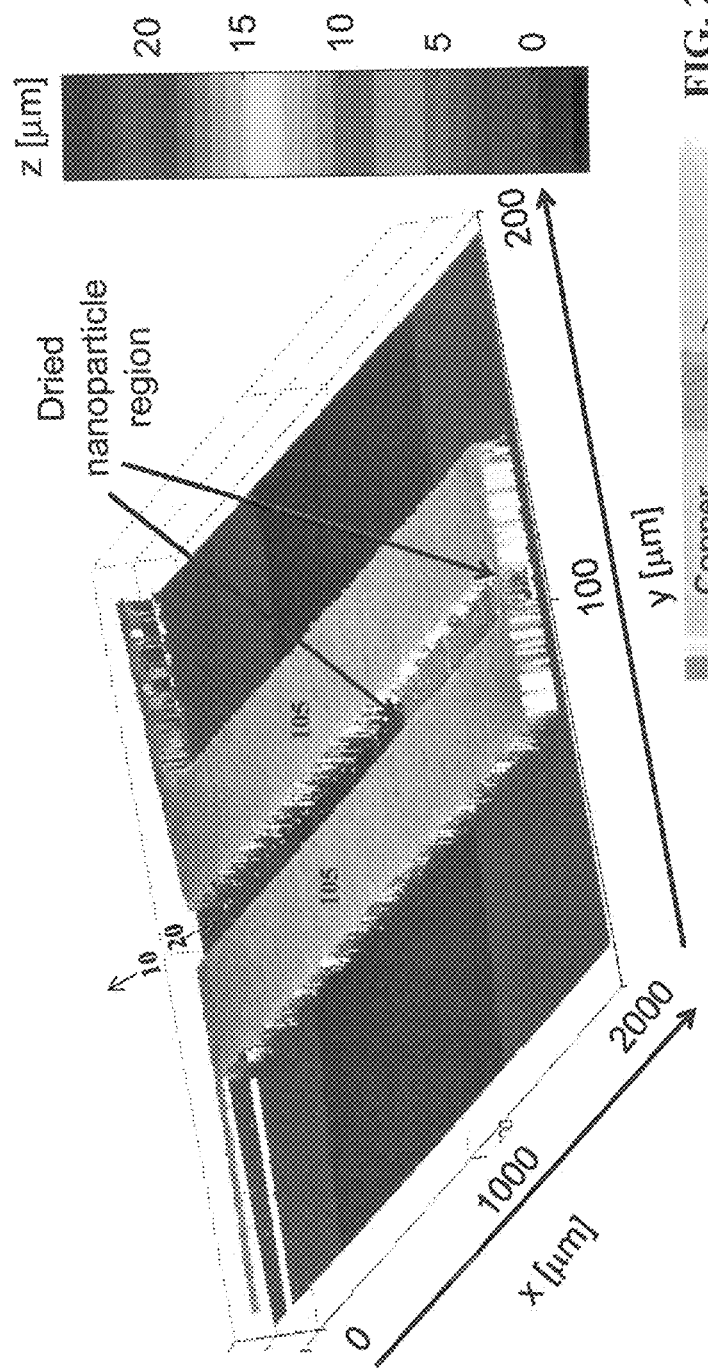

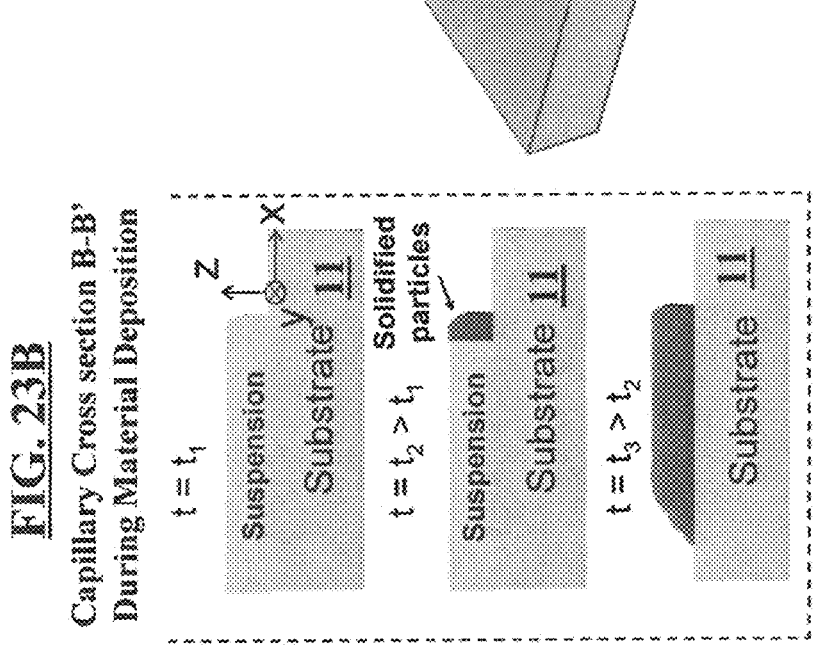

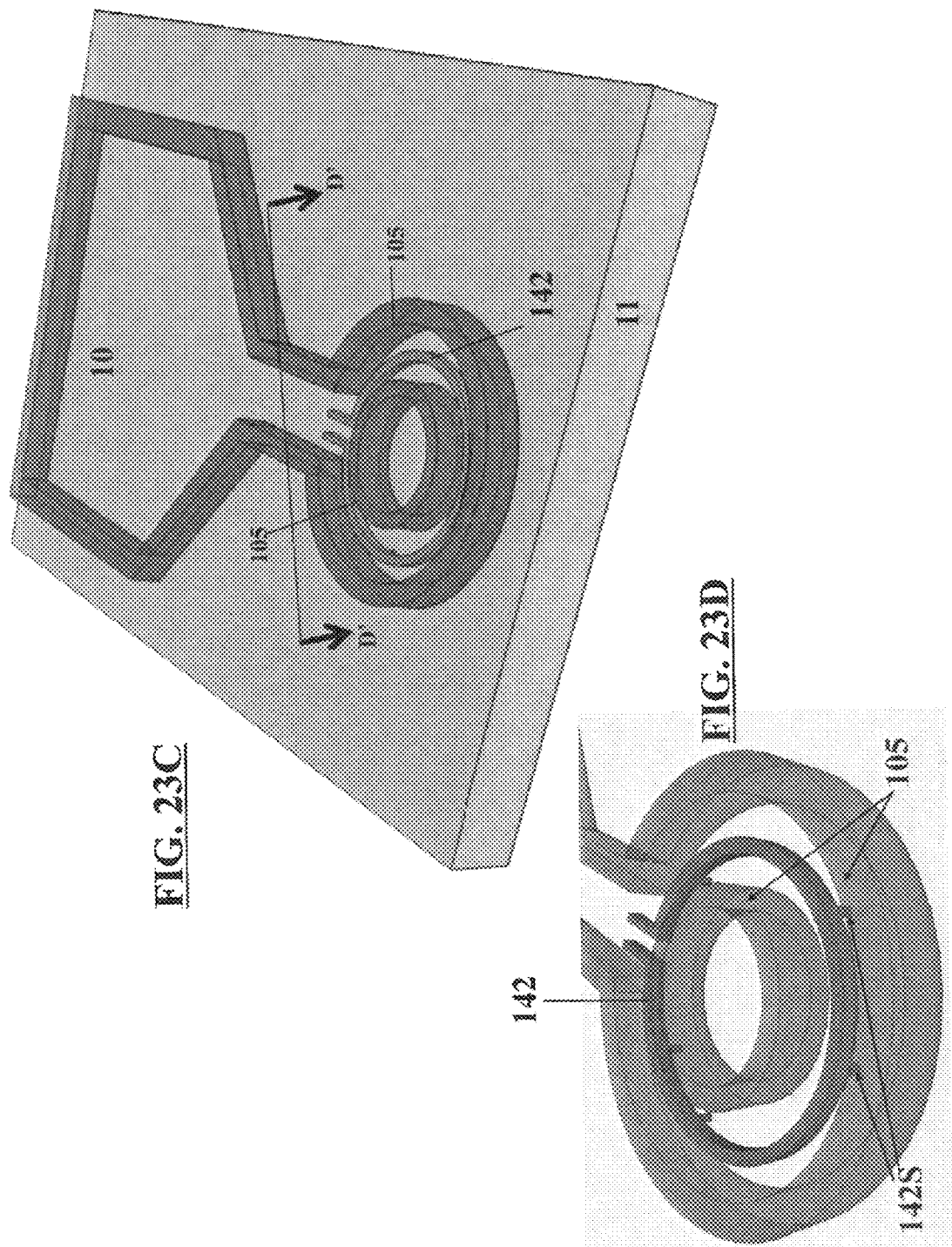

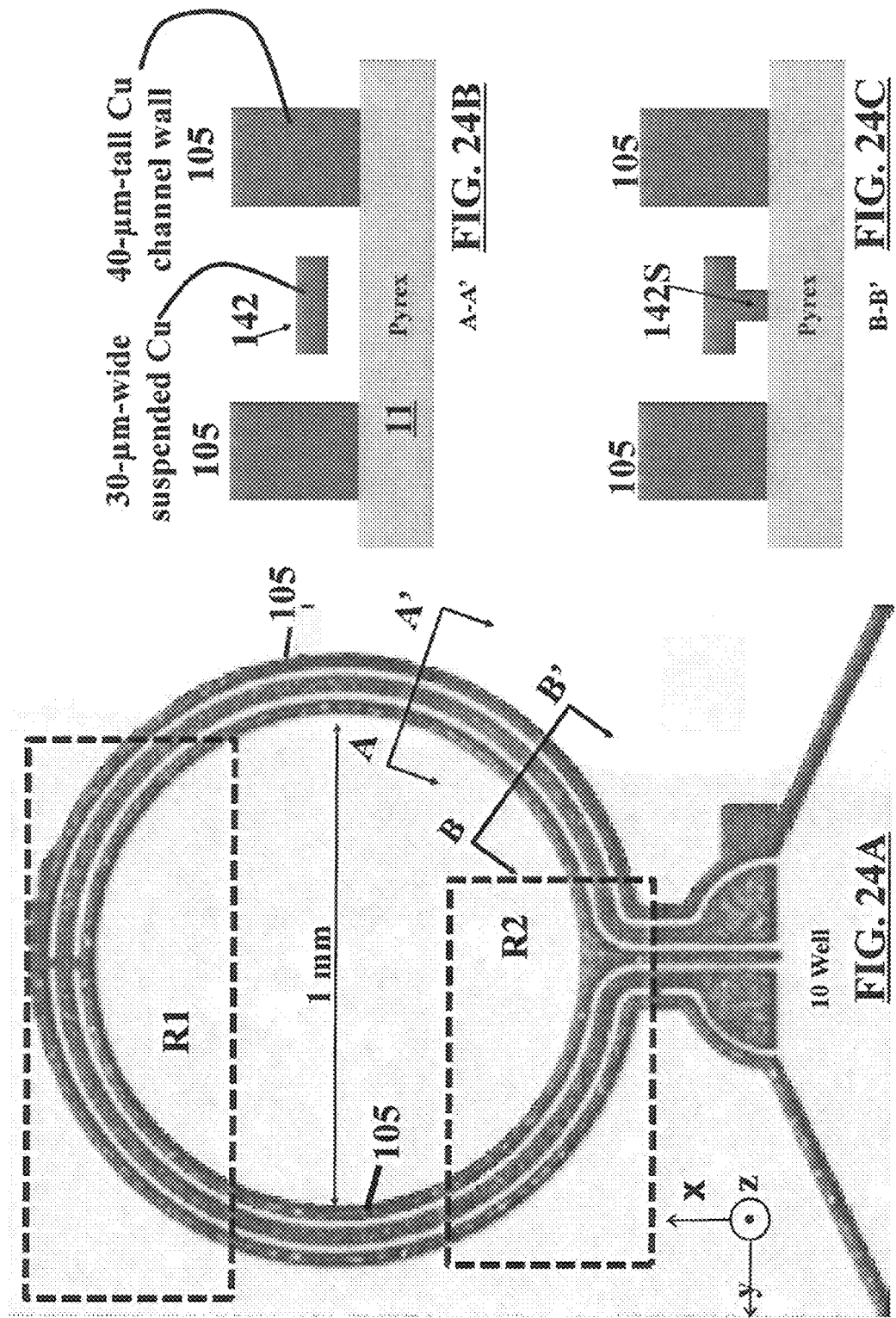

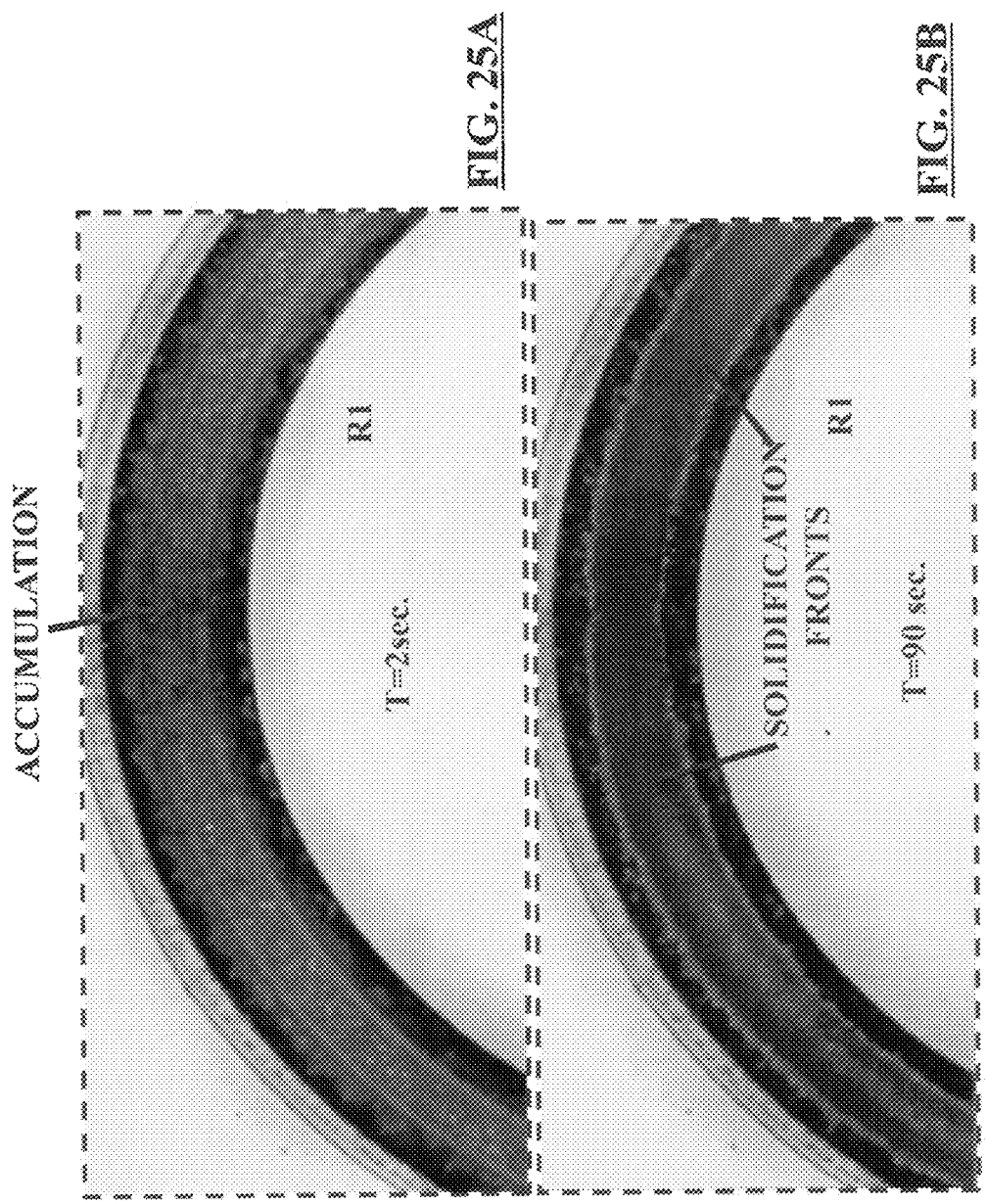

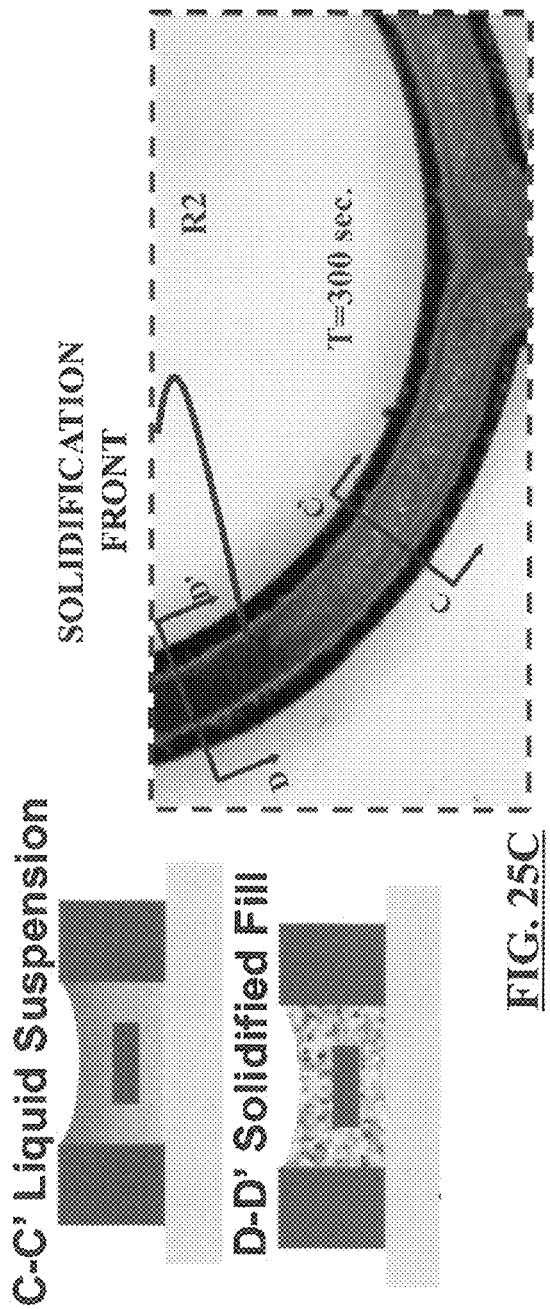
FIG. 25C
FIG. 25D

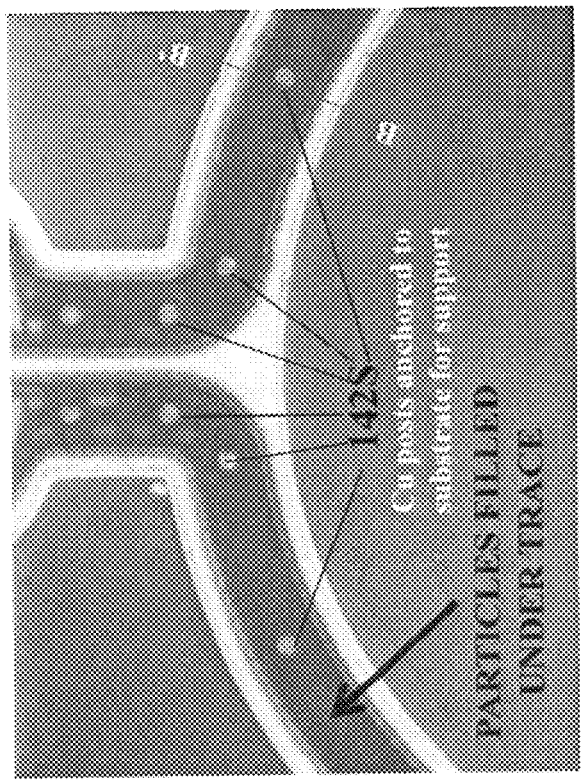
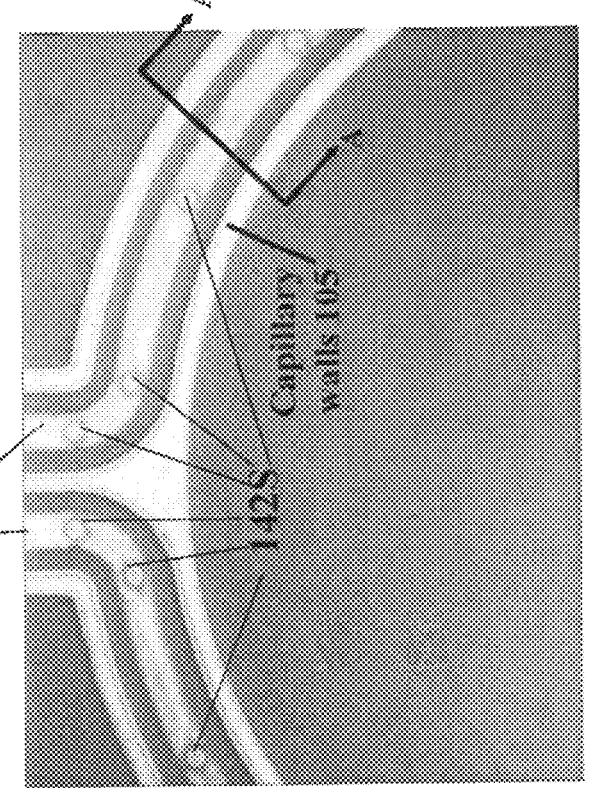
FIG. 27

APPARATUS AND METHOD FOR SUSPENSION WICKING OF NANOPARTICLES INTO MICROCHANNELS

CROSS-REFERENCE TO RELATED APPLICATIONS

This application also claims priority to U.S. application Ser. No. 12/751,308 entitled "Apparatus and Method for Forming Electronic Devices," filed by Dr., Sarah Bedair, et al. on Mar. 31, 2010, which claims priority to U.S. Provisional Patent Application No. 61/308,119, filed on Feb. 25, 2010, both of which are incorporated by reference herein. This application also claims priority of U.S. patent application Ser. No. 11/810,209, filed Jun. 5, 2007, which claims priority to U.S. Provisional Patent Application Ser. No. 60/810,995, entitled "Apparatuses, Systems and Methods Utilizing Capillary Action," filed by Dr. Bedair and G. Fedder, filed Jun. 5, 2006; which are both incorporated by reference herein.

STATEMENT OF GOVERNMENT INTEREST

The embodiments herein may be manufactured, used, and/or licensed by or for the United States Government without the payment of royalties thereon.

BACKGROUND

Background of the Invention

The increasing popularity of miniaturized sensors, actuators, filters, and switched power converters creates a growing need for microscale integrated devices. Accordingly, there exists a need for a low cost material delivery method as an alternative to, inter alia, the traditional micro-fabrication of magnetic cores described above.

BRIEF SUMMARY OF THE INVENTION

A preferred embodiment comprises wicking (via evaporation driven assembly of nanoparticulates through a volatile carrier fluid) reactive nanoconstituents in a suspension mixture with a volatile carrier liquid in to microchannels. The materials are delivered via a liquid suspension deposition into μm-sized structures. The delivery structure consists of a well, and capillary, where the well is the target for liquid deposition. The capillary, where the particles (which may be on the order of nanoparticles) in suspension are deposited, may serve, for example, as a portion of the final product. The capillary action and combined with the evaporation at the end of the channel results in a highly compacted mixture. This method has been described in U.S. application Ser. No. 12/751,308 entitled "Apparatus and Method for Forming Electronic Devices," filed by Dr., Sarah Bedair, et al., on Mar. 31, 2010, in reference to ferrite structures in copper channels for integrated electronic passives concepts. For example, wicking of solutions may be conducted, for example, into 120 μm×2 μm×4 μm volumes.

Nanoparticles of choice may be dissolved and/or suspended in a volatile solvent where the suspension is delivered to a well. Capillary action wicks suspension into the capillary and as solvent evaporates from the capillary, surface-tension-driven replenishment of suspension from the attached well results in an accumulation of nanoparticle solute at the capillary end A preferred method of practicing the present invention comprises forming at least one device on a substrate comprising creating a depository and at least one attached capillary; the depository being of millimeter scale; providing a liquid containing particles in the range 1 nanometer to 1 millimeter; depositing into the depository the liquid containing particles; the liquid flowing into the at least one capillary by capillary action; evaporating the liquid such that the particles form an agglomerate beginning at the end of the at least one capillary with a substantially uniform distribution of the particles within the agglomerate; whereby the agglomerate is used to form a part of the at least one device. The method may further comprise using a substrate comprising silicon and the at least one device may comprise a micron-sized pyrotechnic device, and the step of creating a depository and at least one attached capillary m forming walls may comprise using titanium as an adhesion layer and creating walls by thin film deposition on top of the silicon substrate.

Regarding such a method, the liquid may comprise a variety of solutions and a suspension comprising particles, such as for example, nano-particles, and wherein the nano-particles are mixed with any of polymers and additional nano-particles comprising varying chemical composition. For example, in a preferred embodiment, the delivery methodology comprises the dosing of capillaries with polymers including $NiFe_2O_4$ nanoparticles in suspension for dosing capillaries constituting inductor type passives with large volumes (2 mm×15 μm×10 μm). In addition, the nano-particles may comprise pyrotechnic nano-particles. Moreover, the nano-particles may comprise magnetic nano-particles. Furthermore, the liquid dispensing method may comprise at least one of using a syringe, ink jet printing, zone casting, and dip-pen nano-lithography. Additionally, the target well may comprise an open cavity encompassing a second volume, and the first volume and the second volume may be equal volume amounts. In addition, the passive structure may comprise at least one of a wicking, pyrotechnic or ignition device.

Another embodiment herein provides a method of manufacturing a plurality of integrated passive devices on a single wafer (or substrate), the method comprising providing a wafer, wherein the wafer comprises multiple target wells and each target well is coupled to at least one channel; providing a liquid comprising nano-particles; depositing into each target well a first volume of liquid through a liquid dispensing device; and delivering the nano-particles through the channel, wherein the channel forms a passive structure. In each of the embodiments, depending on the application desired, the walls forming the well and/or channel may be removed or left in place.

Regarding such a method, the manufacturing of the plurality of integrated passive devices may be a mask-less process. Moreover, the liquid may comprise any of a solution and a suspension comprising the nano-particles. Furthermore, the nano-particles may comprise any of pyrotechnic nano-particles and wicking nano-particles Another embodiment herein provides an integrated passive device comprising a substrate; a target well coupled to the substrate and comprising an open cavity encompassing a first volume; a capillary channel coupled to the target well, wherein the capillary channel is filled with a liquid having a second volume, and wherein the liquid comprises nano-particles; and a plurality of capillary walls surrounding the capillary channel, wherein the capillary channel and the plurality of capillary walls forms a passive structure. The capillary width may be in the approximate range of 1 nanometer to 1 millimeter. The particle size may be in the approximate range of 1 nanometer to 1 millimeter. The capillary may be formed by at least two capillary walls which either form part of the final structure of the electronic device or do not form part of the final structure where the walls are removed after formation of the agglomerate.

Regarding such a device, the passive structure may be formed by a spiraling of the capillary channel. In addition, the passive structure may be formed by a straight segment of the capillary channel. Furthermore, the passive structure may be formed by a plurality of spiraled capillary channels, and the spiraled capillary channels may be interconnected and/or stacked atop each other.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications. The representations in each of the figures are diagrammatic and do not indicate actual scales or precise ratios.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments herein will be better understood from the following detailed description, with reference to the drawings, in which:

FIG. 11 is a schematic illustration of a packaging for a MEMS prior to assembly.

FIG. 12 is a schematic illustration of a packaging for a MEMS during assembly showing insertion of wick reacting material in center channel (e.g. Ni/Al NP mixture)

FIG. 13 is a schematic illustration of a packaging for a MEMS during assembly showing contact of solder.

FIG. 14 is a schematic illustration of a packaging for a MEMS during assembly showing the initiation of exothermic reaction/solder reflow FIG. 15A illustrates a schematic diagram of yet another integrated passive device;

FIG. 15B illustrates a cross-sectional diagram of the integrated passive device cut along line A-A of FIG. 15A;

FIG. 15C illustrates a cross-sectional diagram of the integrated passive device cut along line A-A of FIG. 15A and including wicked nano-particles;

FIG. 16 illustrates a perspective view of a torroid inductor integrated passive device;

FIG. 18A illustrates a schematic diagram of configurable integrated passive device;

FIG. 18B illustrates a cross-sectional diagram of the configurable integrated passive device cut along line A-A' of FIG. 18A;

FIG. 18C illustrates a cross-sectional diagram of the configurable integrated passive device cut along line A-A' of FIG. 8A and including wicked nano-particles;

FIG. 18D illustrates a circuit diagram of a transformer for a configurable integrated passive device;

FIG. 18E illustrates a circuit diagram of a stacked inductor for a configurable integrated passive device;

FIG. 18F illustrates a circuit diagram of a capacitor for a configurable integrated passive device;

FIG. 19A is a video illustration of the end of the 2 mm long, 10 μm wide, 15 μm tall capillary during the drying process after the suspension is deposited in the target well at time t=0 (the first moment of suspension-filled capillary) with an initial concentration of $c_o$=10 mg/ml;

FIG. 19B is a video illustration of the capillary of FIG. 19A further illustrating the progression of the nanoparticle filling of the capillary after 4 seconds with the black arrow marking the solidification front transition, $L_T$, showing the transition between liquid suspension and the solidified nanoparticles;

FIG. 19C is a video illustration of the capillary of FIG. 9A further illustrating the progression of the nanoparticle filling of the capillary after 8 sec. with the black arrow marking the transition, $L_T$, showing the transition between liquid suspension and the solidified nanoparticles;

FIG. 19D is a video illustration of the capillary of FIG. 9A further illustrating the progression of the nanoparticle filling of the capillary after 12 sec. with the black arrow marking the transition, $L_T$, showing the transition between liquid suspension and the solidified nanoparticles;

FIG. 21A illustrates white light interferometer measurements (Wycko) after suspension deposition and solvent drying; wherein the dried nanoparticle extent is in the last 800 μm portion of the 2 mm long channel (note the smaller scale in the y-direction);

FIG. 21B illustrates the scanning electron microscope images of a channel end with dried magnetic nanoparticles;

FIG. 21C illustrates the scanning electron micrograph of the end of a channel with dried nanoparticles;

FIG. 21D illustrates the scanning electron micrograph of the end of a channel with dried nanoparticles with increased contrast;

FIG. 23A illustrates a preferred embodiment of the present invention comprising a straight channel or capillary having walls 105;

FIG. 23B illustrates cross sections taken from the line B-B' of FIG. 23A illustrating the suspension and material solidification at times $t_1$, $t_2$ and $t_3$.

FIG. 23C illustrates a preferred embodiment of the present invention comprising a ring-shaped capillary having walls 105 for delivery of a magnetic composite for fabrication of a closed core inductor;

FIG. 23 D illustrates an enlargement of FIG. 23C depicting fabrication of a closed core inductor;

FIG. 24A is a schematic illustration of an embodiment comprising three concentric copper traces forming an inductor along with a well structure; the fabricated, ring-shaped, transmission-line inductor structure comprises, as shown, inner and the outer traces function structurally to form the capillary walls, while the middle functions electrically as the inductive element;

FIG. 24 B is an illustration showing a cross sectional view from lines A-A' of FIG. 24A;

FIG. 24 C is an illustration showing a cross sectional view from lines B-B' of FIG. 24A; wherein the electrically inductive element of FIG. 24C is constructed 30-μm-wide and 10-μm-thick, propped up 10 μm above the surface of the wafer by periodic support posts, as illustrated in the cross sections of FIG. 24C;

FIG. 25A is an enlargement of the R1 section of FIG. 24 illustrating microscopic views of the liquid/material solidification front starting from the point on the ring farthest from the well and progressing towards the entrance at time t=2 seconds;

FIG. 25B is an enlargement of the R1 section of FIG. 24 illustrating microscopic views of the liquid/material solidification front starting from the point on the ring farthest from the well and progressing towards the entrance at time t=90 seconds;

FIG. 25C is an enlargement of the R2 section of FIG. 24 illustrating microscopic views of the liquid/material solidification front at time t=300 seconds;

FIG. 25D is an enlargement of the R2 section of FIG. 24 illustrating microscopic views of the liquid/material solidification front at time t=390 seconds;

FIG. 27 illustrates a microscopic view through backside of clear pyrex wafer before (left) and after (right) deposition of magnetic nanoparticles around and underneath a suspended copper trace 142;

DETAILED DESCRIPTION OF PREFERRED EMBODIMENTS OF THE INVENTION

Figure 1:
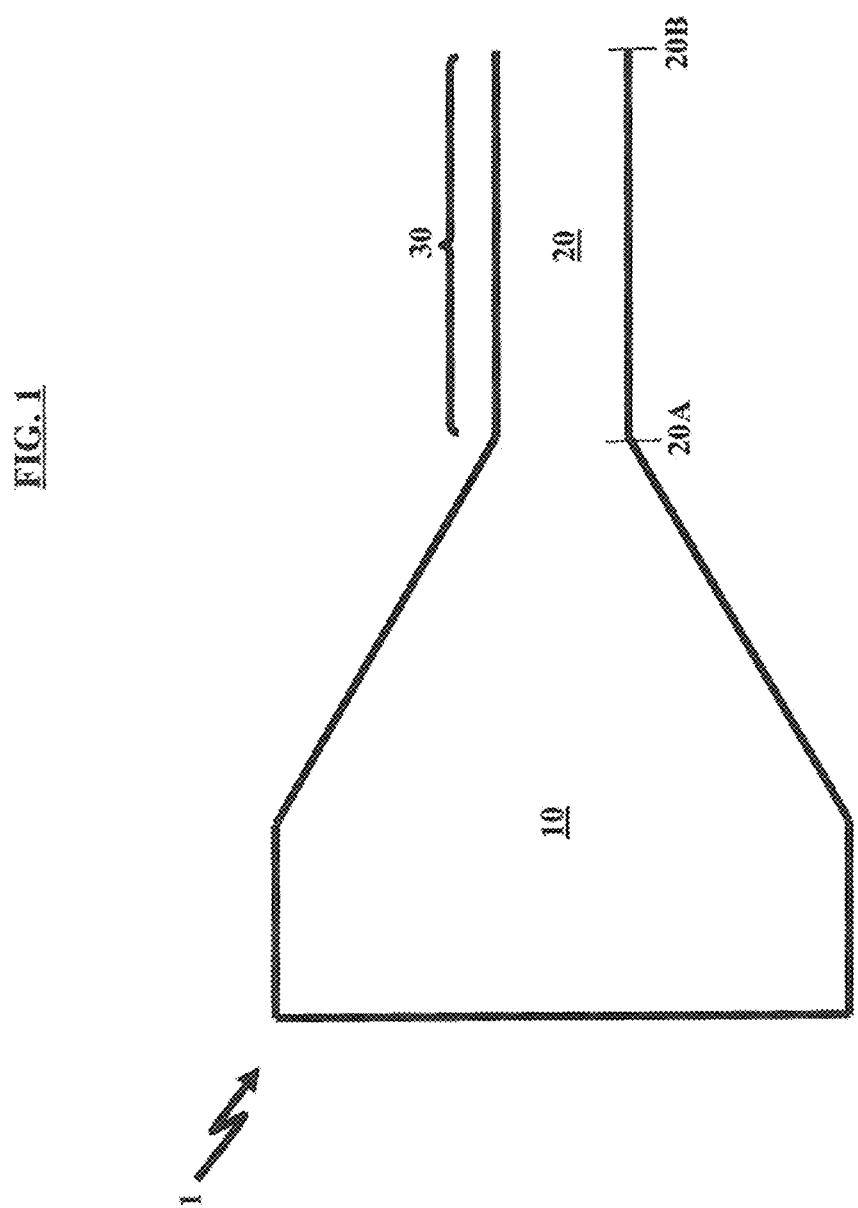
FIG. 1 illustrates a schematic diagram of a basic integrated passive device according to an embodiment herein.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that are farthest away from a substrate.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The embodiments herein provide an apparatus and method of fabricating multiple integrated passive devices types using a single, non-contact fabrication step on a single chip. In addition, the passive devices may be customized to a specified performance depending on the application. Referring now to the drawings, where similar reference characters denote corresponding features consistently throughout the figures, there are shown preferred embodiments.

FIG. 1 illustrates a schematic diagram of a basic integrated passive device 1 according to an embodiment herein. As shown in FIG. 1, integrated passive device 1 includes a target well 10 and a capillary channel 20. In addition, capillary channel 20 forms a passive structure 30, and prevent spillage, contact or interference with other parts, or components which may be nearby. The capillary channel and target well walls may be formed on a glass substrate by thin film deposition on top of the glass layer (such as the substrate of a CMOS). Titanium is typically used as an adhesion layer for securing the walls/structures to the substrate. While not shown in FIG. 1, evenly dispersed throughout capillary channel 20 and passive structure 30 may be nano-particles in a solution or suspension. Such nano-particles may include pyrotechnic, magnetic or high-k dielectric nano-particles. A first volume of liquid containing particles is deposited into the well; a second volume of liquid flows into the capillary by capillary action; evaporating at least part of the liquid such that the particles form an agglomerate at the end of the capillary with the particles having a uniform distribution in the agglomerate; and optionally, the first and second volumes may be equal.

For example, integrated passive device 1 may include electroplated copper (e.g., 18 μm thick) on an insulating substrate 11 (e.g., a Pyrex® substrate available from Corning Inc., New York, USA). A variety of capillary channel (20, 20A-F) lengths and widths may be fabricated using this structure. In addition, a suspension of $BaTiO_1$ nano-particles may be mixed in methanol then deposited by hand using a syringe (e.g., 10 μL syringe) into target well 10. Each target well 10 may occupy an area of approximately 5 mm×5 mm, where such a large scale may be used to facilitate drops deposited by hand. In addition, a more sophisticated deposition technique, such as ink-jet printing, may be used to allow for smaller areas of target well 10. Therefore, the size of target well 10 may be a consideration that takes into account the size and accuracy of the dispensing method (described below). In addition, the thickness of a nano-particle film, when capillary channel 20 may be 45 μm wide, may be approximately 4 μm. The capillary channel may optionally have an end wall as illustrated in FIG. 21B.

The solution delivery platform comprised of a microcapillary 20 connected to a microwell 10 enables picogram solute deposition on structures. Precision material placement in the capillary from a 100 pl drop inkjetted into the well is achieved without the destruction of the microstructure and adjacent submicron electrostatic gaps. This method scales to smaller structures without the need for drop miniaturization. In theory, the solute transfer in the system may be conceptualized in terms of a drying process involving three "regions." The "accumulation" region builds solute concentration in the capillary. The "solidification" region initiates the solidification of solute starting at the free end of the capillary. The "termination" region is characterized by a rapid increase in the solidification due to an increase in the well concentration near the end of the drop lifetime. The accumulation time and solidification rate depend on concentration. FIG. 19A through 19D illustrates the progression of the solidification process in the capillary channel 20, the "free end" being pictured to the right.

Maskless fabrication techniques have several advantages over conventional photolithographic techniques for fabrication on the micro- and nanoscales. These advantages include rapid prototypes where the need for a new mask for each design iteration is eliminated. Direct deposition is an additive process and, therefore, costly materials can be conserved. Elevated processing temperatures causing substrate distortion due to temperature coefficients of expansion mismatch can be eliminated with maskless deposition. Deposition onto suspended structures with micron and submicron scale dimensions may only be realized with maskless techniques since photoresist deposition would lead to the destruction of the device. This is particularly beneficial in areas such as the implementation of chemical sensor arrays, which require multimaterial deposition onto single chip surfaces, and which would require multiple mask steps, whereas maskless techniques such as ink-jet printing and microcapillary deposition are less costly.

Direct material deposition and manipulation on these scales have been previously achieved through techniques such as atomic force microscopy (AFM), "dip pen" lithography and inkjet printing. Although AFM and dip pen lithography techniques provide precise deposition on the nanoscale, both require high precision three-dimensional control of the fabrication unit and may be considered slow processes. Inkjet printing technology is a more rapid deposition technique. However, direct inkjet printing results in lower resolution features, where the state-of-the-art spot size is a few microns in diameter. Nonuniform structures may result from "coffee ring" formation and low viscosity fluids and inks are necessary for repeatable deposition. Direct inkjet deposition necessitates large dimensions leading to, in the case of mass sensitive concentration sensors, poor mass concentration resolution detectors. The deposition method of the present invention provides uniform deposition confined to only the microstructure. Miniaturizing the inkjet drop size, which proves more difficult for repeatable deposition due to issues such as jet clogging, is not necessary for micron and nanoscale material placement using the method of the preferred embodiment. Depositing the drops into a well and having the solution wick into an adjacent suspended capillary alleviates some of the major problems with inkjetting and allows for picogram dosing, precise material placement with microscale resolution, and uniform deposition which is not plagued by the "coffee ring" phenomenon. Alignment of the deposition tool is set by the more relaxed requirement to hit the well. If the inkjet drop placement is misaligned by tens of microns, there is not a direct translation of misalignment to the deposited material, as is the case for other maskless deposition techniques such as dip pen and "fountain pen" nanolithographies. Although the "well" 10 is pictured in FIG. 1 as somewhat funnel shaped, the well may take a variety of forms depending on space availability as well as other constraints. Moreover, although illustrated in FIG. 1 without supporting structure, the capillary 20 may be designed along the length of the structure to be dosed with material having micron-scaled grooves and/or slots which may be dosed with precise material amounts; such as, for example, a 100 pg per drop resolution. The method of dispensing the liquid may comprise at least one of using a syringe, ink jet printing, zone casting, and dip-pen nano-lithography.

Figure 2:
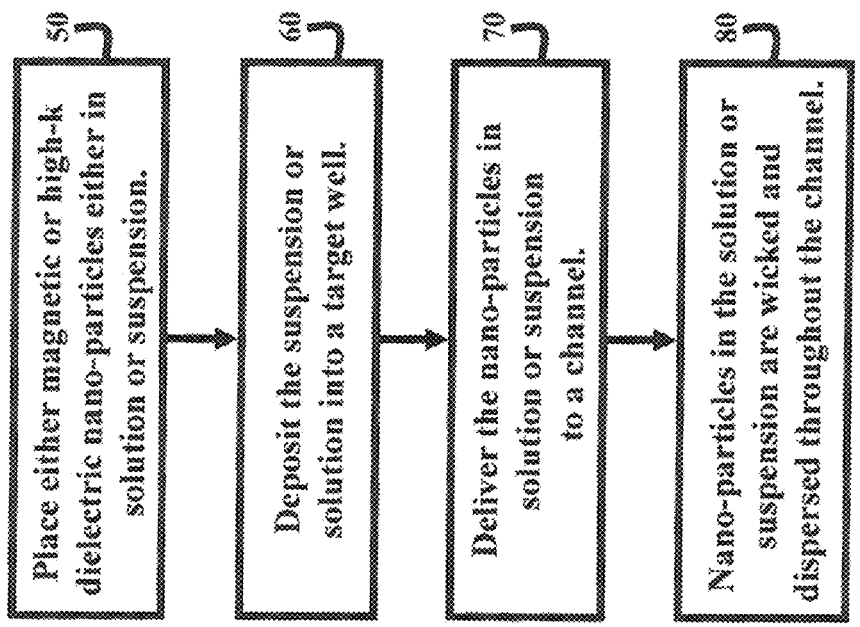
FIG. 2 is a flow diagram illustrating a preferred method according to an embodiment herein.

FIG. 2, with reference to FIG. 1, illustrates a flow diagram according to an embodiment herein. In the method shown in FIG. 2, step 50 describes placing either magnetic or high-k dielectric nano-particles either in solution or in suspension. Step 60 describes depositing the suspension or solution (e.g., as described in step 50) into a target well (e.g., target well 10, shown in FIG. 1) according to a dispensing method. The volume of the target well 10 may be equivalent to the volume deposited in step 60 by the dispensing method. In addition, the dispensing method of step 60 may include, but is not limited to, ink jet printing, zone casting and dip-pen nano-lithography.

Once solution is deposited in step 60, step 70 delivers the nano-particles in solution or suspension (e.g., as described in step 50) to a channel (e.g., capillary channel 20, shown in FIG. 1), where the channel comprises a passive structure (e.g., passive structure 30). In step 80, the nano-particles in the solution or suspension (e.g., as described in step 50) are wicked and dispersed throughout the channel (e.g., capillary channel 20, as shown in FIG. 1) and throughout the passive structure (e.g., passive structure 30). Such a wicking may occur through a physical phenomenon similar to the "coffee ring" formation phenomenon (see e.g., Bedair et al. "Controlled picogram material placement on suspended structures using solution wicking," Solid-State Sensor, Actuator and Microsystems Workshop, Hilton Head, S.C. June 2008, the complete disclosure of which is herein incorporated by reference). Through the "coffee-ring" formation phenomenon, almost 100% of the nano-particles in either solution or suspension (e.g., as described in step 50) are dispersed throughout the capillary (e.g., capillary channel 20, shown in FIG. 1).

In a preferred embodiment, the width of the capillary is the same or smaller than the diameter of the meniscus of the liquid. As seen in FIG. 1, the capillary has a beginning 20A where the liquid first enters the capillary and an end 20B. The capillary action is driven or affected by forces resulting from the surface tension of the liquid and interaction between the molecules of the capillary walls and the liquid. The capillary action has a pumping effect which drives the particles to the end of the capillary and the solidification occurs first at the end of the capillary 20B and proceeds incrementally towards the beginning of the capillary 20A; such that the capillary action or capillary forces produce a pumping effect which produces a uniform distribution of particles at the end of the capillary, and, as the agglomerate forms, produces a uniform distribution of particles within the agglomerate. FIGS. 19A to 19 D illustrate the solidification process.

The method shown in FIG. 2 yields structures (e.g., integrated passive device 1) with aspect ratios equivalent to that of the capillary channel (e.g., capillary channel 20) where the nano-particles are dispersed in step 80. Capillary channel 20, shown in FIG. 1, can be designed in a variety of passives configurations, which is further described below.

Figure 3:
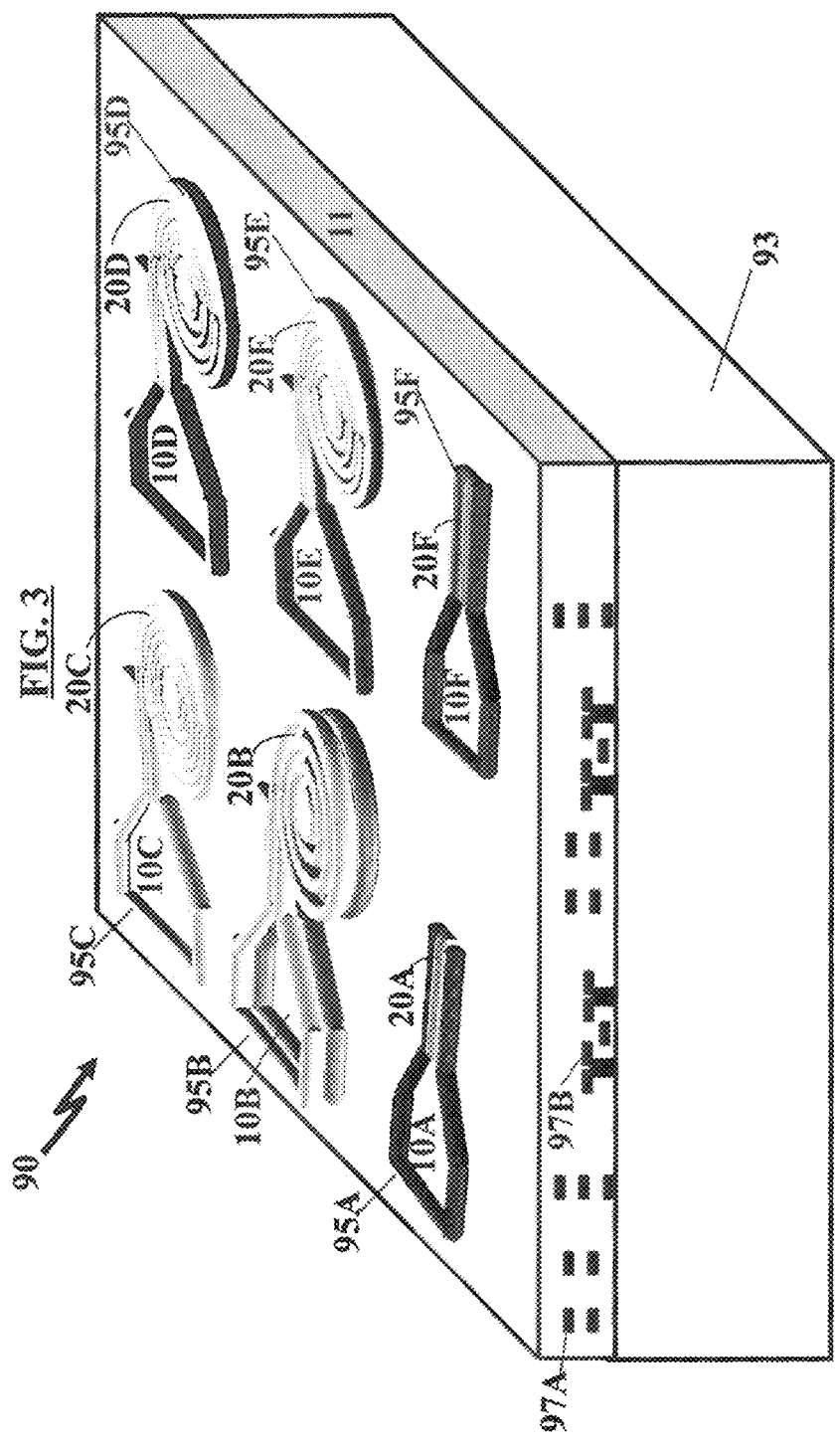
FIG. 3 illustrates a schematic diagram of multiple integrated passive devices on a substrate according to an embodiment herein.

FIG. 3, with reference to FIGS. 1 and 2, illustrates a multimaterial, layer device 90 according to an embodiment herein. In FIG. 3, multi-material, single integrated circuit layer device 90 includes a substrate 11, base 93, a plurality of passive devices 95 and a plurality of active devices 97, which may be embedded in the top layer or substrate 11, which may be, for example, glass (e.g., a Pyrex® substrate available from Corning Inc., New York, USA) positioned on top of a substrate of single crystal silicon. Each passive device 95A-F is not limited to a single material (e.g., a nano-particles in a solution or suspension, as described in step 50, shown in FIG. 2) but may include severably distinct materials (e.g., each material may include distinguishable nano-particle compositions in a solution or suspension, as described in step 50, shown in FIG. 2). The passive devices may include, for example, a high frequency filter capacitor 95A, a power transformer 95B with high permeability $\mu$ core, a low current power, a high frequency RF inductor 95C with high resistivity core, a converter inductor 95D with high $\mu$, low $B_{sat}$ core, a high frequency RF inductor 95E with high resistivity core, and/or a decoupling capacitor 95F with high-k material within the capillary channel 20. As used herein the terminology "permeability $\mu$" or "$\mu$" relates to the relative increase or decrease in the magnetic field inside a material compared with the magnetic field in which the material is located.

Moreover, the multi-material, single platform device 90 may be manufactured according to the method shown in FIG. 2. For example, each passive device 95 shown in FIG. 3 may be dosed with different material types (e.g., according to steps 60-80, shown in FIG. 2), allowing for a plurality of customized passive devices 95A-F on multi-material, single platform device 90, which may be, for example, a single integrated circuit. The exemplary passive devices (e.g., a decoupling capacitor 95F, a power transformer 95B with a high permeability, μ, magnetic core, a low current and/or a high current power inductor 95D 95E, a high frequency RF inductor 95C, and/or a high frequency filter capacitor 95A) may include both a target well (e.g., target well 10) and capillary (e.g., capillary channel 20) construct similar to integrated passive device 1, illustrated in FIG. 1. Each target well 10 may occupy an area of approximately 5 mm×5 mm, where such a large scale may be used to facilitate drops deposited by hand. The solution delivery platform comprised of microcapillaries 20A-F connected to microwells 10A-F enables solute or nanoparticle deposition into structures with picogram resolution. The capillaries 20A-F may be designed along the length of the structure as shown in FIG. 3 forming micron-scaled grooves and/or slots which may be dosed with precise material amounts of material; such as, for example, a 100 pg per drop resolution. The liquid may be a solution comprised of a solution and/or suspension comprising particles, such as for example, nano-particles, and wherein the nano-particles are mixed with any of polymers and additional nano-particles comprising varying chemical composition. As an example, the delivery methodology may comprise the dosing of capillaries with polymers including NiFe2O4 nanoparticles in suspension for dosing capillaries constituting inductor type passives (e.g., 95 D, 95E) with volumes as large as 2 mm×15 μm×10 μm, where the length of the capillary may cover dimensions as small as microns and as large as millimeters. In addition, the nano-particles may comprise high-k dielectric nano-particles (e.g. 20F within the structure of decoupling capacitor 95F). Moreover, the nano-particles may comprise magnetic nano-particles. Furthermore, the liquid dispensing method may comprise at least one of using a syringe, ink jet printing, zone casting, and dip-pen nano-lithography. Such maskless fabrication techniques have several advantages over conventional photolithographic techniques for fabrication on the micro- and nanoscales; including rapid prototypes, conservation of costly materials and elimination of masks, elimination of elevated processing temperatures which cause substrate distortion due to temperature coefficients of expansion mismatch. As mentioned above, deposition onto suspended structures with micron and submicron scale dimensions is realized without photoresist deposition which leads to the destruction of the certain devices. These advantages are particularly beneficial in areas such as the implementation of device arrays, where each device requires a material which varies from that required from another device in the same array.

Figure 4:
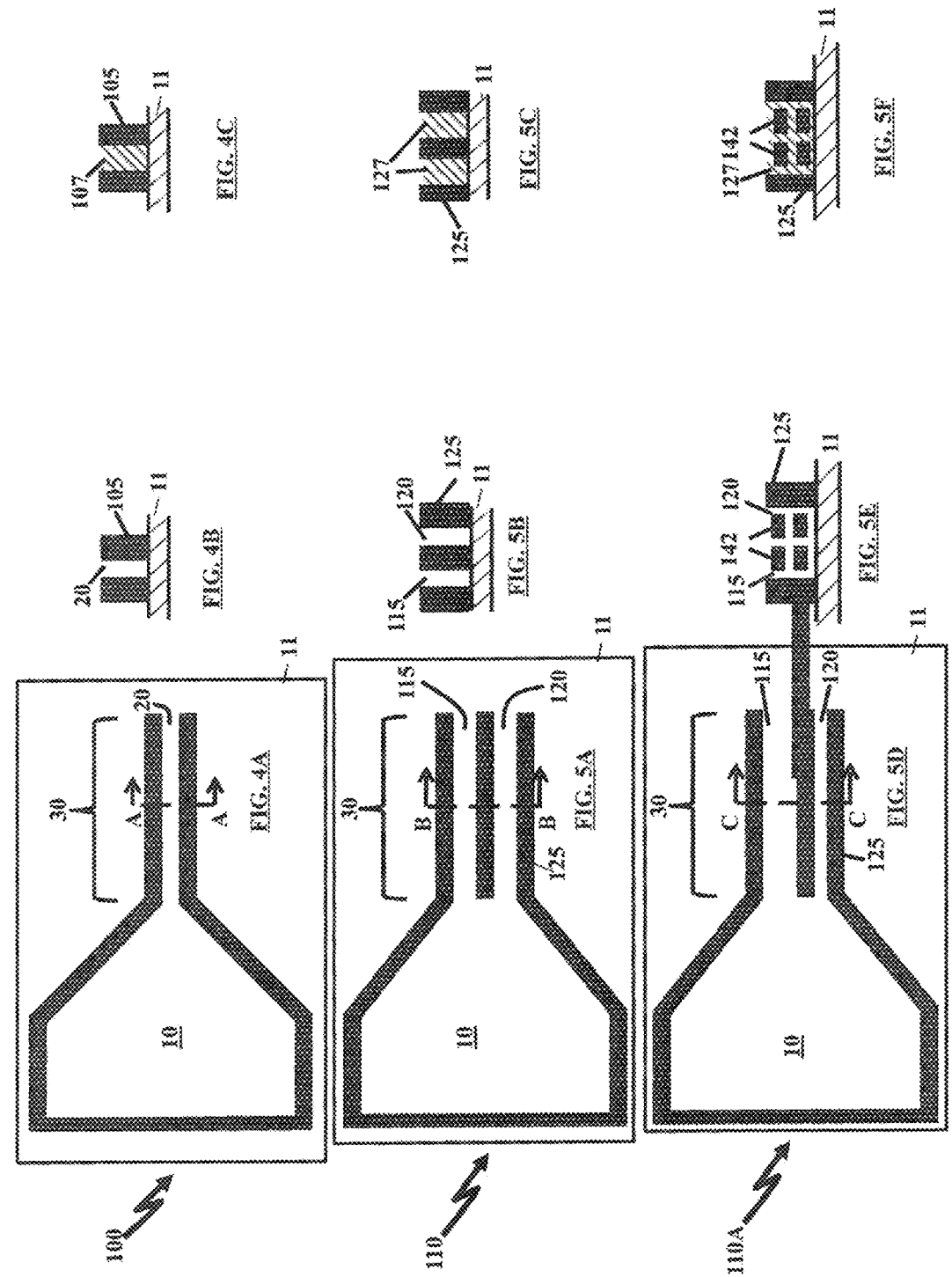
FIG. 4A illustrates a schematic diagram of an integrated passive device according to an embodiment herein.
FIG. 4B illustrates a cross-sectional diagram of the integrated passive device cut along line A-A of FIG. 4A according to an embodiment herein.
FIG. 4C illustrates a cross-sectional diagram of the integrated passive device cut along line A-A of FIG. 4A and including wicked nano-particles according to an embodiment herein.
Figure 5:
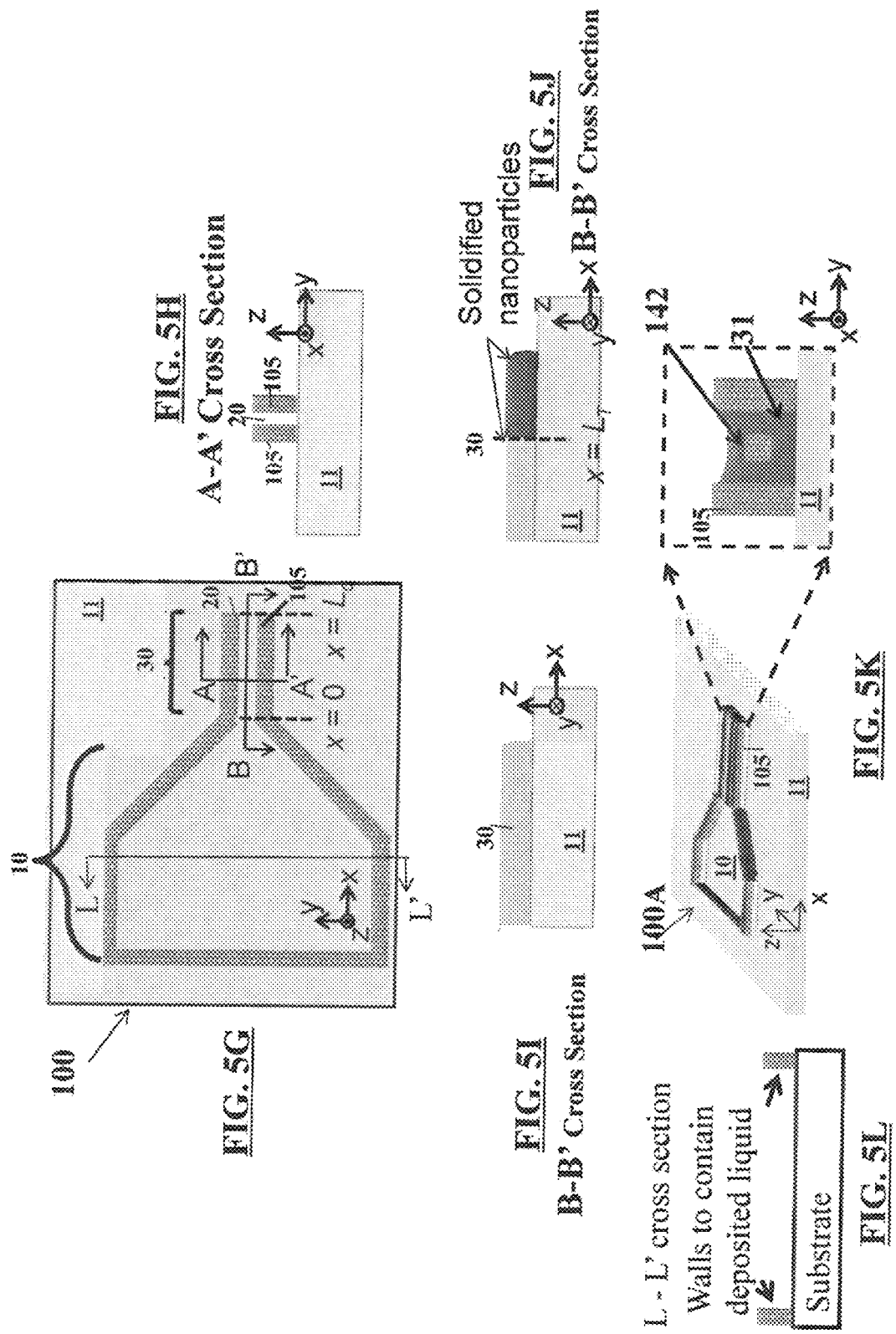
FIG. 5A illustrates a schematic diagram of an alternative integrated passive device according to an embodiment herein.
FIG. 5B illustrates a cross-sectional diagram of the integrated passive device cut along line B-B of FIG. 5A according to an embodiment herein.
FIG. 5C illustrates a cross-sectional diagram of the integrated passive device cut along line B-B of FIG. 5A and including wicked nano-particles according to an embodiment herein.
FIG. 5D illustrates a schematic diagram of another integrated passive device according to an embodiment herein.
FIG. 5E illustrates a cross-sectional diagram of the integrated passive device cut along line C-C of FIG. 5D according to an embodiment herein.
FIG. 5F illustrates a cross-sectional diagram of the integrated passive device cut along line C-C of FIG. 5D and including wicked nano-particles according to an embodiment herein.
FIG. 5G illustrates a schematic diagram of a target well 10 and a capillary 30.
FIG. 5H illustrates a cross-sectional diagram of the structure of FIG. 50 device cut along line A-A of FIG. 5G according to an embodiment herein.
FIG. 5I illustrates a cross-sectional diagram of the structure of FIG. 50 device cut along line B-B of FIG. 5G according to an embodiment herein.
FIG. 5J illustrates a cross-sectional diagram of the structure of FIG. 5G device cut along line B-B of FIG. 50 depicting the solidified nanoparticles.
FIG. 5K illustrates a structure according to an embodiment herein with an associated cross-sectional view showing an embedded element 142.
FIG. 5L illustrates a cross-sectional view of the device of FIG. 5G taken along lines L-L'.
Figure 6:
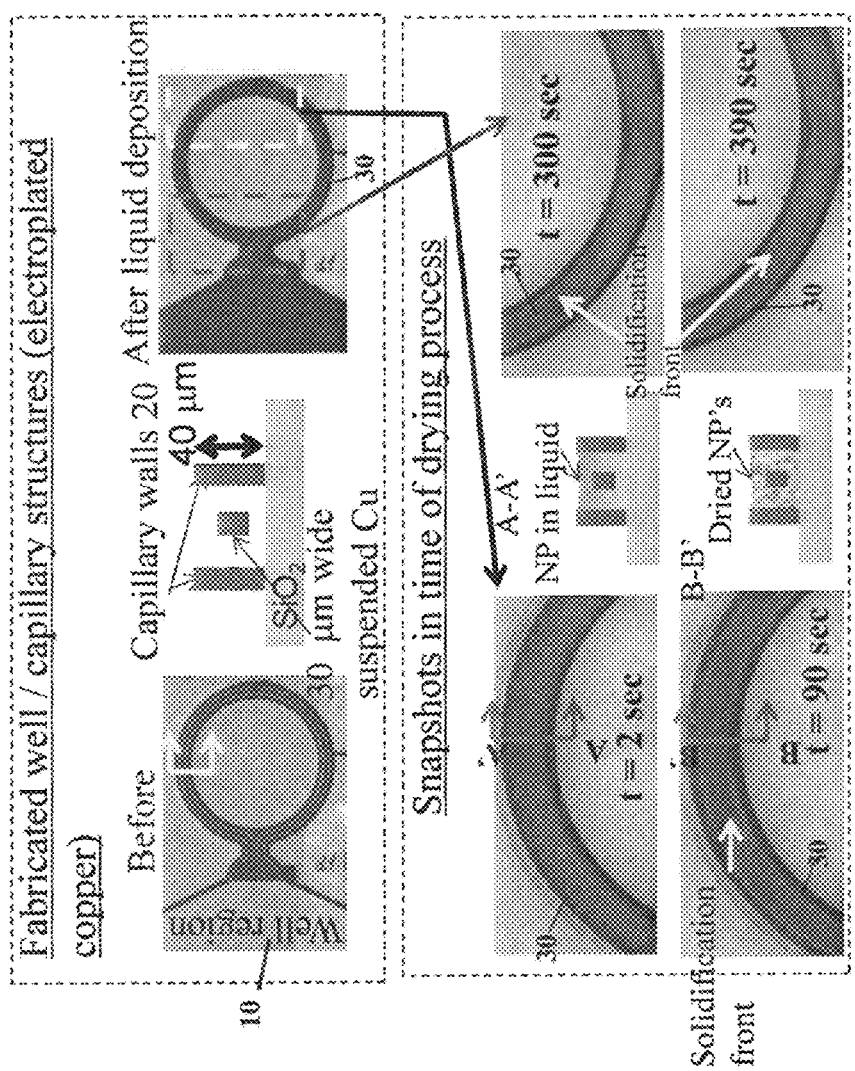
FIG. 6 is a schematic illustration of a fabricated well and capillary structure showing snapshots of the drying process.
Figure 7:
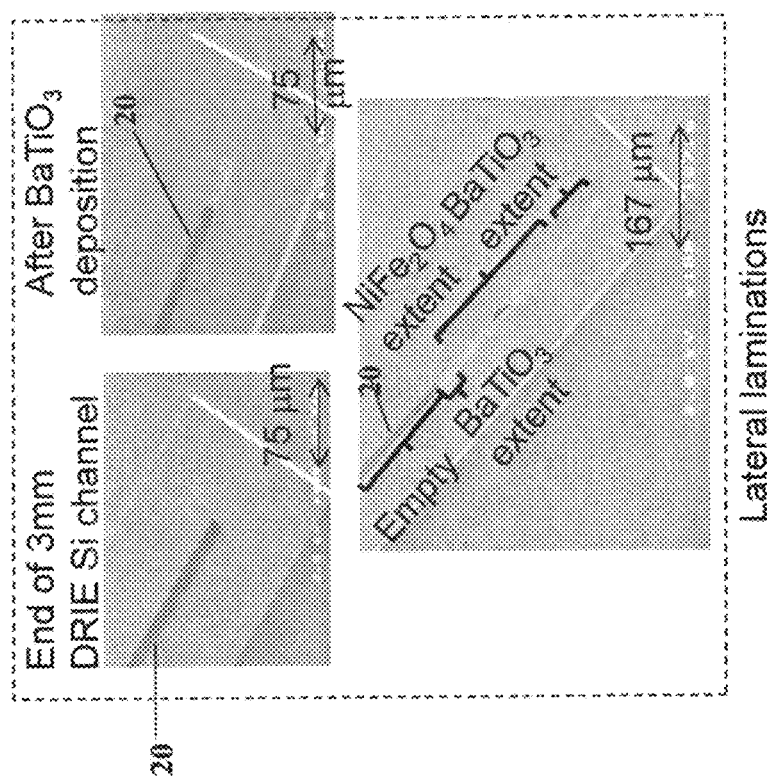
FIG. 7 is a schematic illustration of a preferred embodiment showing lateral laminations.

As previously mentioned, capillary channel 20 (shown in FIG. 1) may be designed to include any integrated passive device of interest. FIGS. 4A through 5L and 16, 17A and 17B, with reference to FIGS. 1 through 3, are non-limiting examples illustrating different possible integrated passive device structures. FIG. 4A is a schematic diagram of integrated passive device 100 according to an embodiment herein. Integrated passive device 100, shown in FIG. 4A, includes target well 10, capillary channel 20 and passive structure 30. FIGS. 4B and 4C illustrate integrated passive device 100 along cross-sections A-A and illustrates capillary wall 105, where FIG. 4B illustrates cross-section A-A and FIG. 4C illustrates cross-section A-A with wicked nano-particles 107 (e.g., dielectric nano-particles). In the alternative, the nano-particles may be pyrotechnic and/or materials forming a fuze. FIG. 5A is a schematic diagram of integrated passive device 110 according to an embodiment herein. Integrated passive device 100, shown in FIG. 5A, includes target well 10, and passive structure 30, where passive structure 30 includes capillary channel 20. In addition, FIG. 5A illustrates integrated passive devices 110. FIG. 5B is a cross-sectional view taken along cross-sections B-B of FIG. 5A; and illustrates capillary wall 125, and capillary channels 115 and 120. FIG. 5C illustrates the same cross-section B-B with wicked nano-particles 127 (e.g., dielectric nano-particles). In the alternative, the nano-particles may be pyrotechnic or exothermic reaction materials. FIG. 5D through 5F are schematic diagrams of integrated passive device 110A according to an embodiment herein. As shown, integrated passive device 110A is an alternative embodiment to integrated passive device 110, shown in FIGS. 5A through 5C. FIG. 5D includes 4 embedded conductor structures 142 which may be copper traces or the like. As known to those skilled in the art, additional alternative embodiments are possible, though not shown, to the embodiments shown in FIGS. 5A through 5F.

In FIGS. 4A through 5F, passive devices 100, 100A, 110 and 110A may include capillary channels 20, 115 or 120 filled with high-k dielectric nano-particles after solvent drying. The amount of material filling or percentage of the cross-sectional area of the channel with nano-particles depends on the liquid solid contact angle as well as aspect ratio of the capillary (e.g., capillary channel 20, 115 or 120). In addition, integrated passive devices 100, 100A, 110 and 110A (shown in FIGS. 5A through 5F) includes multiple capillary channels (e.g., capillary channel 115 and capillary channel 120), which yields a higher capacitance per unit area than a single channel design (e.g., integrated passive device 100, shown in FIGS. 4A through 4C). FIGS. 5E and 5F show structure cross-sections where stacked conductive lines 142 can be configured to achieve higher capacitance densities.

Figure 8:
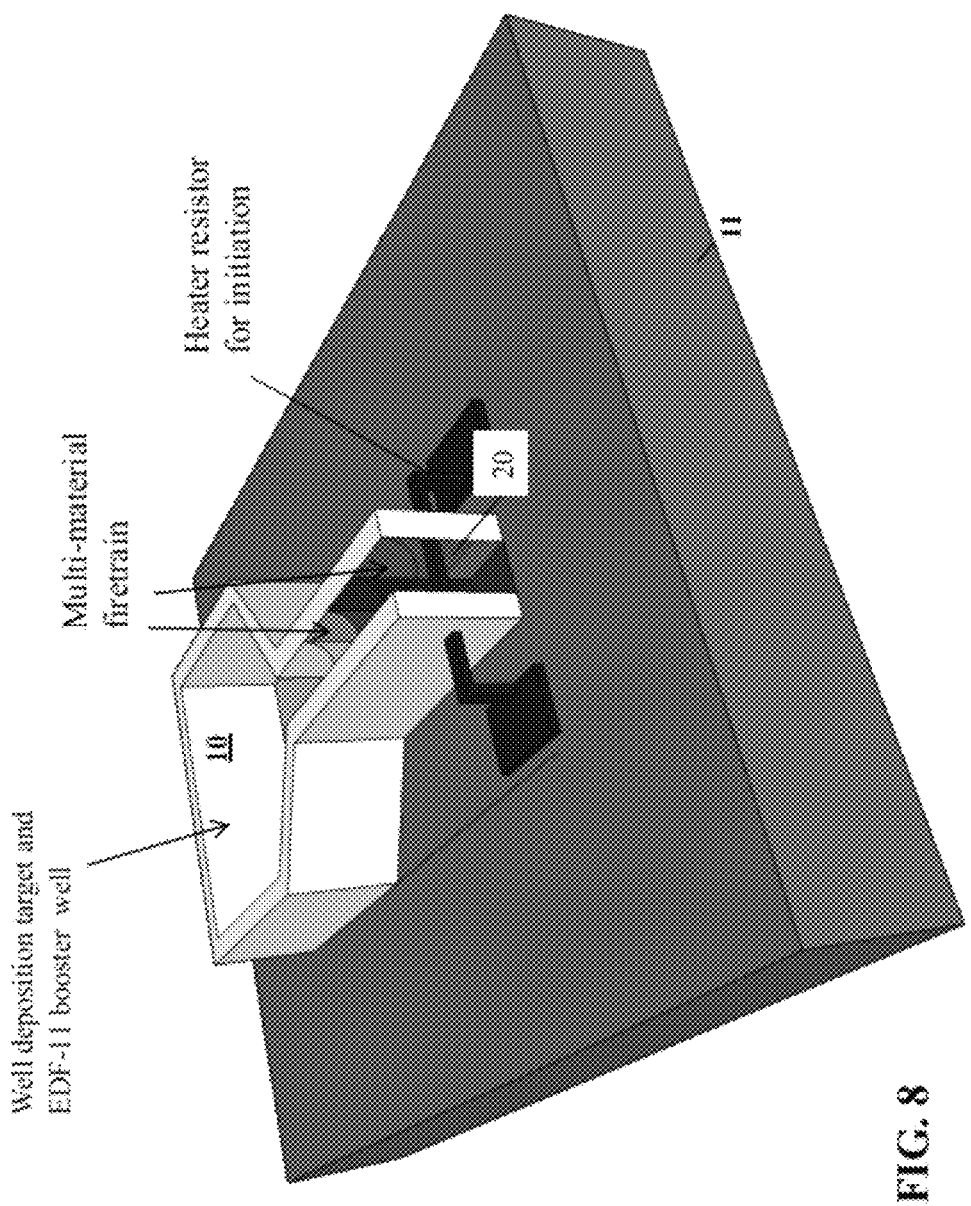
FIG. 8 is a schematic illustration of a fabricated well and capillary structure for a multimaterial firetrain.

Illustrated in FIG. 8 is a well 10 and capillary 20 structure for a multimaterial firetrain (as shown by the arrows in FIG. 8). The multimaterial firetrain may comprise nano/microparticle formulations of lead styphnate (lead 2,4,6-trinitroresorcinate, $C_6HN_3O_8Pb$), or Azide. The embodiment shown in FIG. 8 may comprise new initiation materials (nano-particle reactive mixes) such as, for example, Al/Ni, Ti/B, Ni/Si, Pd/Al, Zr/B, Thermite. The embodiment shown in FIG. 8 enables fusing applications such as multi-material loading of channels to create lateral laminations for firetrains or monolithically integrated pyrotechnic delay lines.

Suspension Wicking Applications

A preferred embodiment suitable for pyrotechnic usages may comprise a microchannel on the order of approximately 10 to 100 microns wide that may be fabricated in a MEMS approach like electroplating copper or deep reactive ion etching into silicon. Intermetallic nano particle mixes may be, for example, Ni/Al, Ti/B, Zr/B, Ni/Si, Pd/Al, thermite mixes, or exothermic reaction materials. Alternatively, other reactive particles combined with an oxidizer may also be used. Examples include Si or Al nanoparticles with stable oxygen nanoparticle compounds like perchlorate mixtures. Experiments with inert (not reactive) nanoparticles have shown very high density of nanoparticle packing when dried this way in U.S. application Ser. No. 12/751,308. A preferred embodiment utilizes reactive particles to achieve similar densities. The high densities of composite reactive nanoparticle mixtures enables an increased contact of surface area compared to a solution dried on an open surface or in a open top container without a replenishing reservoir as shown in FIG. 1. Drying of dissolved solutions pursuant to method has the capability of producing equally dense solids of solute in the channel. Focused heat through joule heating, focused optical energy or chemical energy may then be applied to initiate the reaction. One end of the channel may have an embedded hot wire bridge connected to traces that would allow a hot spot to be applied to initiate the reaction. The reaction would be self sustaining at this point and can initiate an explosive firetrain or it could be used as a pyrotechnic delay or exothermic reaction materials meandering around the chip.

The concepts of the present invention include drying solutions of energetic mixes; such as, for example, both primary and secondary explosive formulation. Such mixes could be dried in stages achieved through subsequent depositions of varying suspensions to fabricate entire firetrains, via lateral material laminations, at the wafer level in concurrent quantities in the thousands per wafer using this method of fill.

Another preferred embodiment would incorporate solder micro or nanoparticles into the mix to make a self heating solder 201 once the reaction is initiated. The mix of solder and energetic particles could be intimate or separate and placed in proximity for the heat of reaction to melt it (201M in FIG. 15). This concept is shown in, inter alia, FIGS. 11-15.

The present invention has advantages over other drying methods to apply particles mixtures like solder pastes and energetic formulations, because it effectively makes void-free high aspect ratio structures of highly dense mixtures of reactive nanoparticles that have not been made any other way.

One application for the invention is in micro-scale firetrains for micro electromechanical system (MEMS) fuzing for weapons. Traditionally the initiation channels are pressed into holes in machined cylinders, a solution of primary ink is dried on a hot-wire bridge, or filled with a paste. All of these methods introduce reliability problems if the energetic particles do not make intimate contact with the hot bridge.

The use of the preferred methodology of the present invention to apply localized heat to an area of a chip to reflow solder could solve other problems in the microsystem community. This could be utilize in MEMS or die level packaging where the heat reflow a solder perform or wicked nano particles of solder used to seal a package, potentially hermetically.

Other possible uses of the present invention include application of heatsinks to chips, attaching two pieces of metal, or self destruct sensitive die. It may be used to initiate and expand to produce gas to expand bellows like MEMS structures for high force, high displacement linear or rotational actuation.

Novel features of the present invention include (1) compatible wide range of materials, (2) No limit to the number of reactants, (3) Flexibility in combination and percent mix, (4) Precise placement of heat even embedded under an lid, (5) Local heating only; limited heat affected, zone (5) Intimate contact with heating bridge, and (6) High aspect ratio filling in a controlled and repeatable manner.

Device Applications

FIGS. 15A through 15C are schematic diagrams illustrating different views of integrated passive device 130 according to an embodiment herein. Integrated passive device 130, shown in FIG. 15A, includes a target well, a capillary channel 20 connected to the target well, inductor bonding pads 135. Capillary channel 20 is shown in a three-turn spiral inductor configuration having walls 140 and a suspended conductor 142 (which may be copper or a similar metal). The passive structure shown in FIG. 15A is an inductor core, which includes capillary channel 20 wound in a three-turn spiral and capillary channel 20 is used to deliver magnetic nano-particle materials from the target well. In addition, FIGS. 15B and 15C illustrate integrated passive device 130 along cross-sections A-A and illustrates capillary wall 140, where FIG. 15B illustrates cross-section A-A and FIG. 15C illustrates cross-section A-A with wicked nano-particles (e.g., dielectric nano-particles). Suspended element 142 is depicted between walls 140 in FIG. 15B and as embedded element 142 in FIG. 15C. Although FIG. 15A shows a number of turns, larger inductance values may be achieved with a larger number of turns. In electrical circuits, any electric current, i, produces a magnetic field and hence generates a total magnetic flux, $\Phi$, acting on the circuit. This magnetic flux, due to Lenz's law, tends to act to oppose changes in the flux by generating a voltage (a back EMF) in the circuit that counters or tends to reduce the rate of change in the current. The ratio of the magnetic flux to the current is called the inductance of the circuit. To add inductance to a microcircuit, inductors such as that shown in FIG. 15A may be used.

Figure 22A:
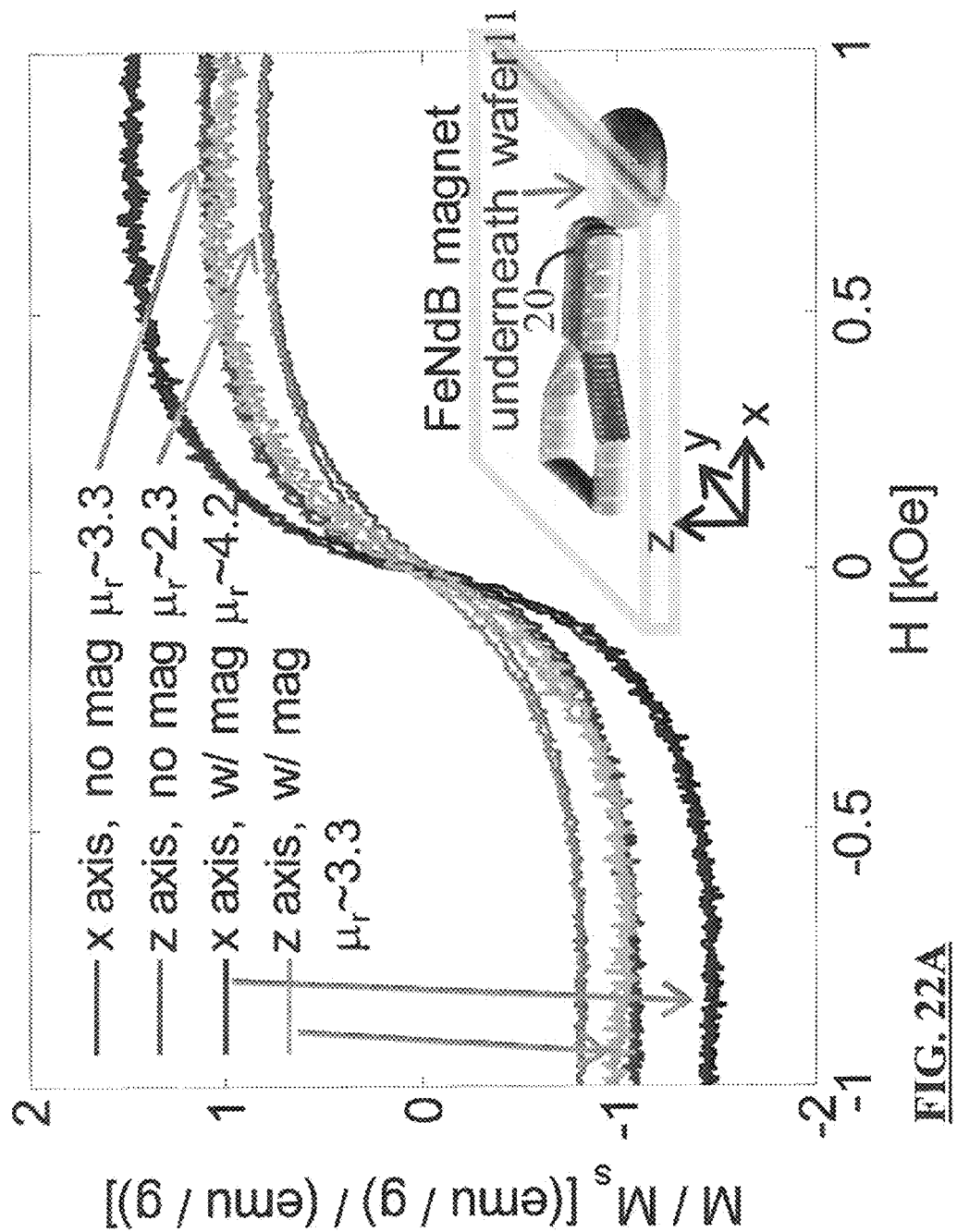
FIG. 22A graphically illustrates magnetic loop measurements after suspension deposition and solvent drying under two delivery conditions: with and without magnet. Measurements along the channel axis (x-axis) and perpendicular to the channel axis (z-axis) are shown. The inset illustration illustrates that for the channel dosed with a magnet, the magnet was manually positioned underneath the wafer close to the channel end.

A further example of an inductor/transformer construction according to the principles of the present invention is depicted in FIG. 16, which illustrates a perspective view of a toroid inductor embodiment. It is known that toroidal coils are used in high-frequency coils and transformers and can have higher Q factors and higher inductance than similarly constructed solenoid coils, due largely to the diminished turns required around the closed magnetic path provided by the core. Since the magnetic flux is largely confined to the core of the toroid, energy is less apt to be absorbed by nearby objects. For torus-shaped magnetic fields, the poloidal flux direction threads the "hole" in the center of the torus, while the toroidal flux direction is parallel the core of the torus. Optionally, in accordance with the principles of the present invention, as shown in FIG. 22A, by placing a magnet underneath the wafer or substrate during the material delivery of magnetic nano-particles, the permeability may be increased. Using a magnet during the material delivery effects the alignment of the field as depicted schematically in FIG. 22B, which methodology also may be incorporated in the embodiments of FIGS. 16-17B, as well as FIGS. 1, 3, 5, 15A-C, and 23 in cases where involving the delivery of magnetic nanoparticles. Liquid suspensions dropped in magnetic fields ensure that the easy axis of the material is oriented in the preferred direction of flux lines. As used herein the easy axis refers to the energetically favorable direction of the spontaneous magnetization in a ferromagnetic material.

Figure 17B:
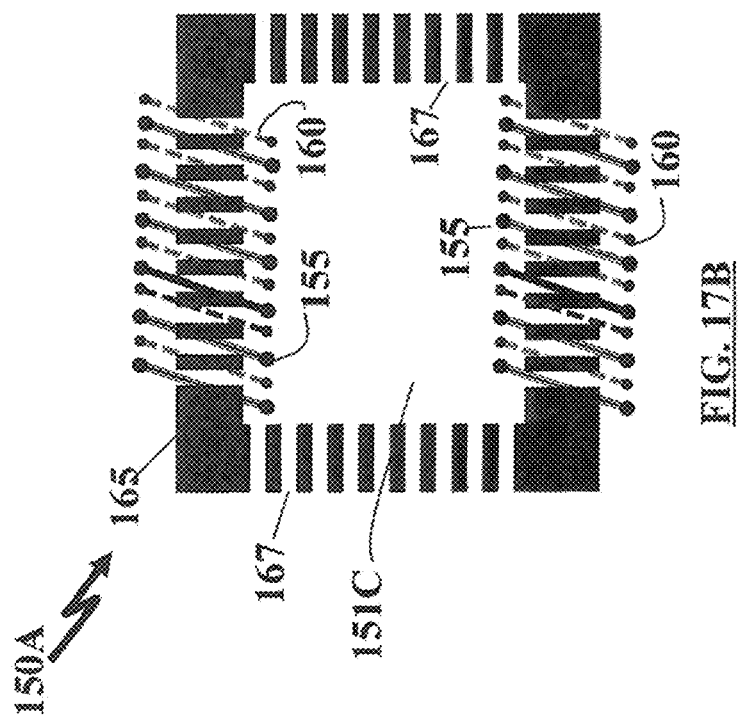
FIG. 17B illustrates a schematic diagram of an alternate construction technique for a torroid inductor integrated passive device without the a central target well.
Figure 17A:
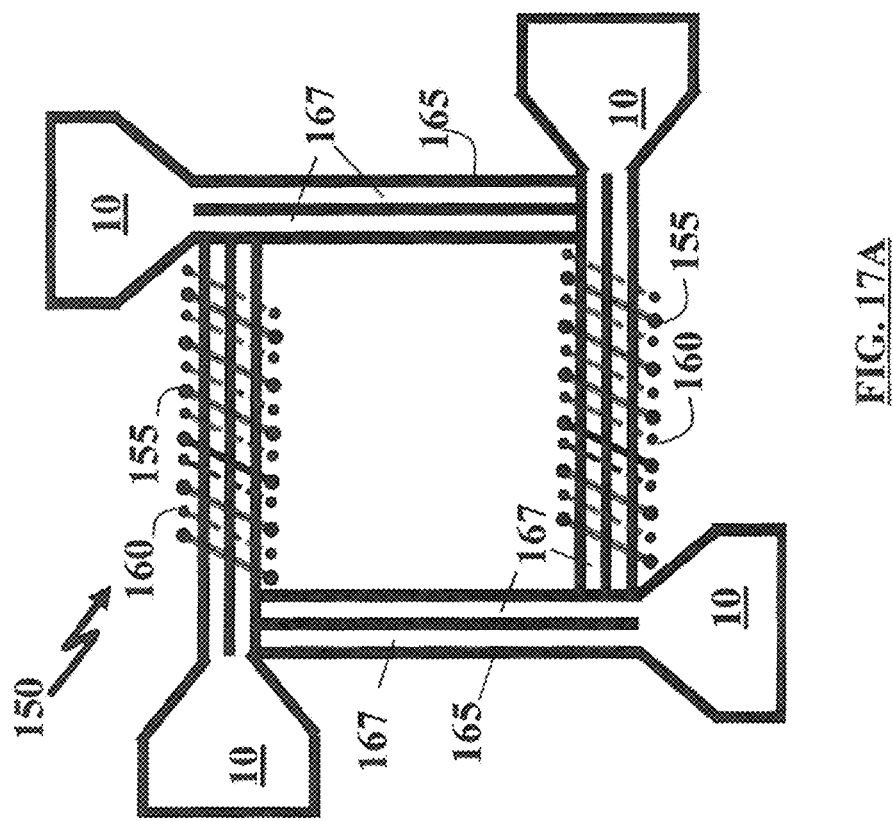
FIG. 17A illustrates a schematic diagram of one construction technique for a torroid inductor.

FIG. 16 is a schematic rendition of a toroidal transformer or inductor 150 where the magnetic flux is created from passing current through the primary coil windings 155 (solid lines) which induces current on the secondary coil windings 160 (dotted lines) through coupling to the same magnetic core 165. Examples of alternative well and channel delivery systems for creation of the magnetic core 165 in accordance with the principles of the present invention are shown the embodiments illustrated in FIGS. 17A and 17B. As shown in FIG. 17A, device 150 includes four target wells 10. Liquid suspensions may be dropped in magnetic fields to ensure that the easy axis of the suspension material is oriented in the preferred direction of the flux lines. Material flows into channels 167 in the magnetic core 165 through capillary action as described in detail above. In FIG. 17B, the center of the transformer 151C serves as a target well to feed core capillary channels 167 designed throughout magnetic core 165. As shown in FIGS. 17A and 17B, the core capillary channels 167 serve as a construct for material delivery. In addition, the channels 167 in FIG. 17B serve as an insulating structure to achieve magnetic core laminations. The magnetic core laminations in channels 67 within the magnetic core 165 (shown in FIG. 17B) are necessary to reduce eddy current losses for high frequency operation in miniature inductors and transformers.

In addition, a spiral channel design similar to that shown in FIGS. 15A through 15C may be implemented as a stacked inductor, capacitor, or transformer configuration. For example, FIGS. 18A through 18F illustrate stacked, multi-layer spiral 170 according to an embodiment herein. Stacked spiral 170 includes target well (the entrance to which is indicated by an arrow), capillary channel 20, and a plurality of nodes 175. Passive device 30 includes capillary walls 180, which form a conductor/insulator/conductor stack. Depending on the configuration and type of nano-particles 180 wicked (e.g., according to the method shown in FIG. 2), and connections between nodes 175, any of a transformer (e.g., FIG. 18D), a stack inductor (e.g., FIG. 18E) and a capacitor (e.g., FIG. 18F) maybe be implemented. For example, if magnetic nano-particles 185 are deposited in target well (e.g., as described in steps 50 and 60 shown in FIG. 2), then a transformer or an inductor may be implemented. Moreover, a capacitor may be achieved with stacked spiral 170 when high-k dielectric nano-particles 185 are deposited in the target well 10 (e.g., as described in steps 50 and 60 shown in FIG. 2).

FIG. 5K is an exemplary design where the preferred embodiment/method may be implemented to deliver materials for an inductor core. FIG. 5K shows an inductor where a center conductive line 142 is suspended in the capillary used for material delivery. The cross section shows an envisioned illustration of the magnetic material 31 surrounding the center suspended conductor 142 after suspension delivery and solvent evaporation in the capillary. The magnetic material 31 may be core-dried magnetic NPS.

As described above, the delivery method consists of a well and a capillary as illustrated in FIG. 4A-C. Once liquid is deposited in the target well, capillary forces drive the suspension into the capillary. After the capillary is loaded with suspension, the evaporation of the liquid off of the top surface of the capillary is replenished by the same volume of liquid from the well. This results in a liquid velocity profile, v(x,t), where x is the distance from the well and t is time. A constant supply of suspension from the well results in a rapid growth of the nanoparticle concentration at the end of the capillary. The concentration reaches a point where the suspension liquid phase transitions to a solid phase. This results in a solidified material that grows from the end of the channel back towards the well entrance (x=0 in FIG. 1c-1d). The theory describing this physical phenomenon is summarized below, however, a more detailed derivation of the evaporation driven deposition of polymer in solution is described in S. S. Bedair, et al., "Picogram Material Dosing of Microstructures," J. App. Physics, (2009), hereby incorporated by reference.

The one-dimensional liquid velocity profile in the capillary is described by the following $$\frac{\partial}{\partial x}v(x, t.) = -\frac{1}{\rho h_c} \times \frac{J_s}{1+\exp\left[\frac{c(x, t) - c_r}{\mu}\right]} \quad (1)$$

where $\rho$ is the liquid density, $h_c$ is the height of the liquid in the capillary, $J_S$ is the solvent evaporation flux in units of (kg/m²/sec), c(x,t) is the one-dimensional concentration profile, and $c_r$ is a critical concentration describing the liquid to solid phase transition. A Fermi function in the second term on the right-hand side of Eq. (1) is used to describe the concentration dependant evaporation rate of the solvent. The evaporative flux is proportional to the liquid-vapor pressure jump, $P_l$-$P_v$, in the meniscus region described by the augmented Young-Laplace equation $$P_l - P_v = \sigma K - \frac{\overline{A}}{\delta^3}, \quad (2)$$

where the first term on the right-hand side is the capillary pressure where $\sigma$ (N/m) is the liquid surface tension and K (m⁻¹) the liquid curvature. The second term is the disjoining pressure where $\overline{A}$ (J) is the disjoining pressure constant and $\delta$ is the liquid thickness. The one-dimensional concentration profile is described by $$\frac{\partial}{\partial t}c(x, t.) = -\frac{\partial}{\partial x}[c(x, t.) \times v(x, t.)] + D \times \frac{\partial^2}{\partial x^2}c(x, t.) \quad (3)$$

where D is the nominal diffusion coefficient of the nanoparticles in the suspension.

The boundary conditions of zero velocity and zero flux of nanoparticles at the end of the channel, $L_c$, are $$v(L_c, t.) = 0, \frac{\partial}{\partial x}c(L_c, t.) = 0. \quad (4a), (4b)$$

At the channel entrance, x=0, the following boundary conditions were used:

$$\frac{\partial}{\partial x}v(0, t.) = -\frac{1}{\rho h_c} \times \frac{J_s}{1+\exp\left[\frac{c(0, t) - c_r}{\mu}\right]}, \quad (5a), (5b)$$

$$c(0, t.) = \frac{c_o V_{drops}}{V_{drops} - \alpha \times t}.$$

where $V_{drops}$ is the suspension volume deposited into the well and $\alpha$ is the evaporation rate of the solvent in the channel in units of (m³/sec).

The coupled partial differential equations in Equations (1), (3), (4) and (5) are solved numerically by finite element analysis using comsol multiphysics' (Burlington, Mass.) partial differential equation solver. The following parameters were used: $J_s$=0.015 kg/m²/sec, $\rho$=792 kg/m³, $h_c$=7 μm, $L_c$=2 mm, $c_r$=800 kg/m³, $c_o$=10 kg/m³, μ=50, $\mu_D$=50, D=1×10⁻²⁰ m²/sec, $V_{drops}$=2 μL, α=4.8×10⁻¹¹ m³/sec. The evaporation rate of the solvent in the well was calculated based on the diffusion limited drying process of a drop on a surface, as described in detail in S. S. Bedair, "Sub-nanogram Mass Loading CMOS-MEMS Cantilever Resonator Oscillators for Gas Detection," Ph.D. dissertation, Carnegie Mellon University, Pittsburgh, Pa., 2008, hereby incorporated by reference. The model is most sensitive to the evaporation flux in the channel. This evaporation flux was chosen as a fitting parameter to fit to the experiments described in the next section. An effective evaporative flux approximately 10 times larger than the flux due to the calculated capillary pressure jump is measured as compared to the 100× extracted evaporation flux with the previously reported 2-μm-wide, 4-μm-tall capillaries. See S. S. Bedair, et al., "Picogram Material Dosing of Microstructures," Journal Applied Physics, (2009) (hereby incorporated by reference). This enhancement in flux is largely due to the evaporation in the meniscus region due to the disjoining pressure jump, as further described in Z. Z. Xia, et al., "Capillary Assisted Flow and Evaporation Inside. Circumferential Rectangular Micro Groove," International Journal of Heat and Mass Transfer, Vol. 52, pp. 952-961 (2009)(hereby incorporated by reference), which has a complex dependence on and is inversely proportional to the capillary width.

Laboratory Work

Figure 9:
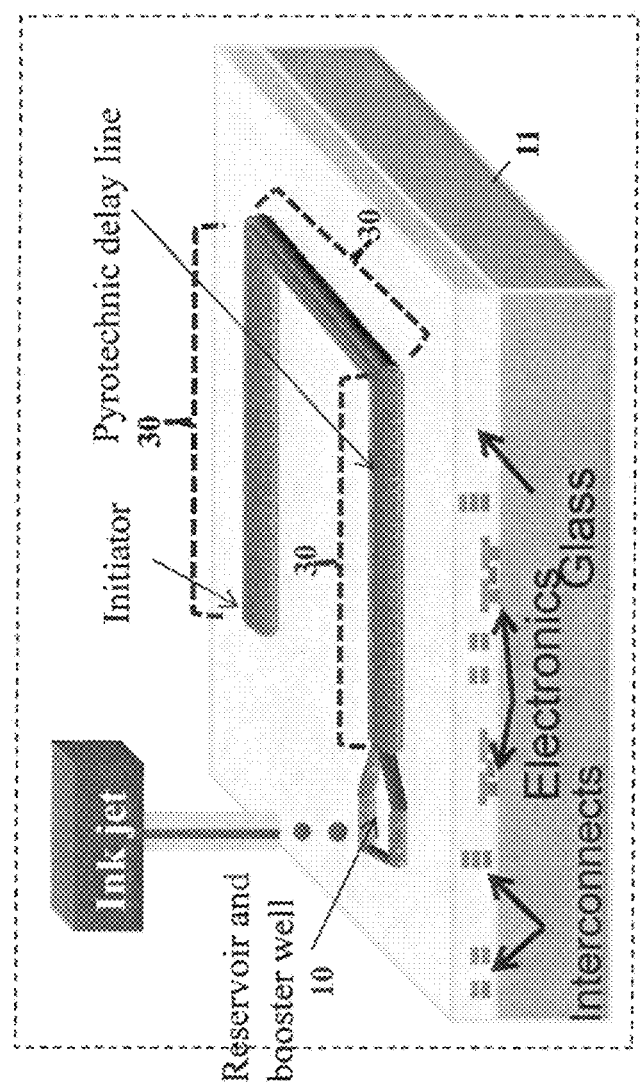
FIG. 9 is a schematic illustration of a preferred embodiment well and capillary structure showing ink jet depositing of a pyrotechnic delay line and initiator.
Figure 10:
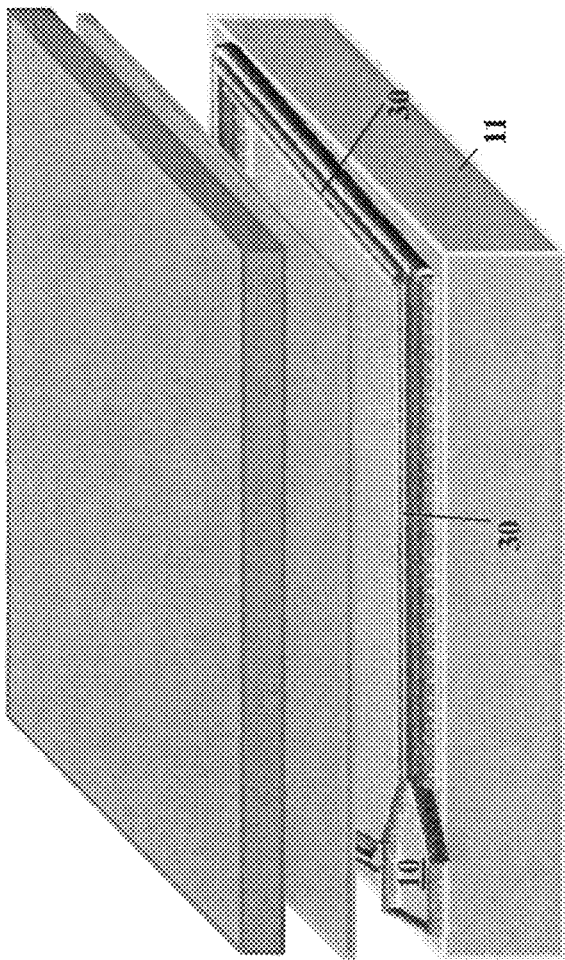
FIG. 10 is a schematic illustration showing chip scale MEMS fuze packaging using exothermic nanoparticle reactions (like Ni/Al) for solder reflow providing localized heating.
Figure 20:
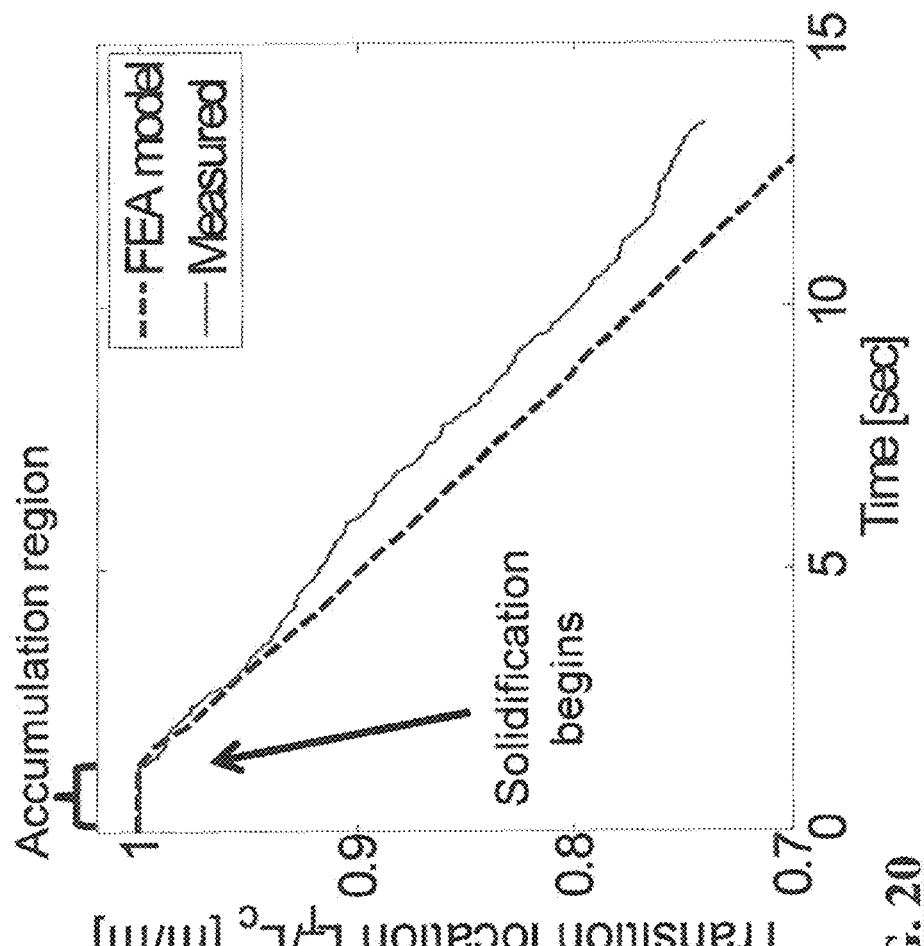
FIG. 20 is a graphical depiction of the progression of the solidification front as shown in FIGS. 19A-19D (normalized to channel length, $L_c$) monitored through custom software developed in Matlab™ wherein the normalized solid/suspension transition, $L_T/L_c$, is plotted as a function of time after the suspension deposition into the target well (the experimental position transition location is compared to the model solved by FEA)5124.

Well and capillary structures may be fabricated by electroplating copper 15-μm-thick into a photoresist mold on a pyrex substrate 11. For example, the capillary length and width may be 2 mm and 10 μm, respectively. In previous work, a 10 mg/ml methanol suspension of spherically shaped, 30-nm-diameter, 30 nm $NiFe_2O_4$ nanoparticles (purchased from MTI Corporation) was prepared and followed by ~2 μL deposition of suspension into the well by hand using a 10 μL syringe. FIG. 19 shows images (captured by video) at different times during the drying process, where the t=0 image (FIG. 9A) represents a capillary filled with suspension with an initial concentration of $c_o$=10 mg/ml. The arrows in the images of FIG. 19 indicate the solidification front, $L_T$, which is the transition between liquid suspension and the solidified nanoparticles. The solidification front (normalized to channel length, $L_c$) is monitored through custom software developed in Matlab™ as shown in FIG. 20. In FIG. 20, the growth of the front is compared to the model solved by FEA.

The drying process may be described, inter alia, by two regions; accumulation and solidification. Accumulation is the time required after the liquid fills the capillary for the concentration at the capillary end to increase until the suspension at that end first becomes solidified. A 1.3 sec accumulation time was measured and compares well to the model (1.7 sec). A measured solidification rate of 44.2 μm/sec also compares well (51 μm/sec).

FIG. 21A illustrates white light vertical scanning interferometer measurements (Wycko) after suspension deposition and solvent drying; wherein the dried nanoparticle extent is in the last 800 μm portion of the 2 mm long channel. The different colors represent height with the walls 105 being approximately 16 microns high. Optical measurements (FIG. 21A) show an approximately 800-μm-long nanoparticle extent at the end of the channel after total solvent drying. The approximate height, $h_c$, of the dried material in the channel was 7 μm. The volume of the nanoparticle extent was extracted from the optical measurements and estimated to be $5.1 \times 10^{-8}$ $cm^3$. Scanning electron micrographs of the end of a channel with dried nanoparticles are shown in FIGS. 21C and 21D.

Another well and capillary structure was dosed in the same manner with ~2 μL of suspension, but in this case a cylindrical FeNdB magnet (3.16 mm diameter and 1.60 mm thickness) was placed underneath the 500 μm thick pyrex wafer for field assisted alignment of the magnetic nanoparticles during the drying process, as schematically illustrated in the inset in FIG. 22. The magnet was manually aligned so that the center of the magnet was spaced ~2 mm from the channel end in the x-direction and ~1.3 mm below the channel end in the z-direction. The magnet was kept there during suspension delivery to the well and drying of the solvent, as schematically depicted in the inset illustration of FIG. 22. The static magnetic x-directed field, $H_x$, versus the z-directed field, $H_z$, can be approximated based on the geometry and position of the magnet relative to the channel. For a more indepth study of the subject, see D. K. Cheng, Field and Wave Electromagnetics, 2nd ed., Reading, Mass.: Addison-Wesley, 1989, pp. 243-266, hereby incorporated by reference. The relative magnitudes of the fields, $H_x/H_z$, range between 9 at the channel end and 1 at the channel-well interface. Interferometry measurements show an approximate $5.4 \times 10^{-8}$ $cm^3$ volume of $NiFe_2O_4$ in the channel dosed while in the presence of the magnet. A 5% increase in delivered material volume is attributed to the liquid delivery technique where the dispensed liquid volume is manually determined through the hand-held microsyringe. A more sophisticated dropping technique such as ink jet printing would mitigate the variation in liquid volume.

Figure 22B:
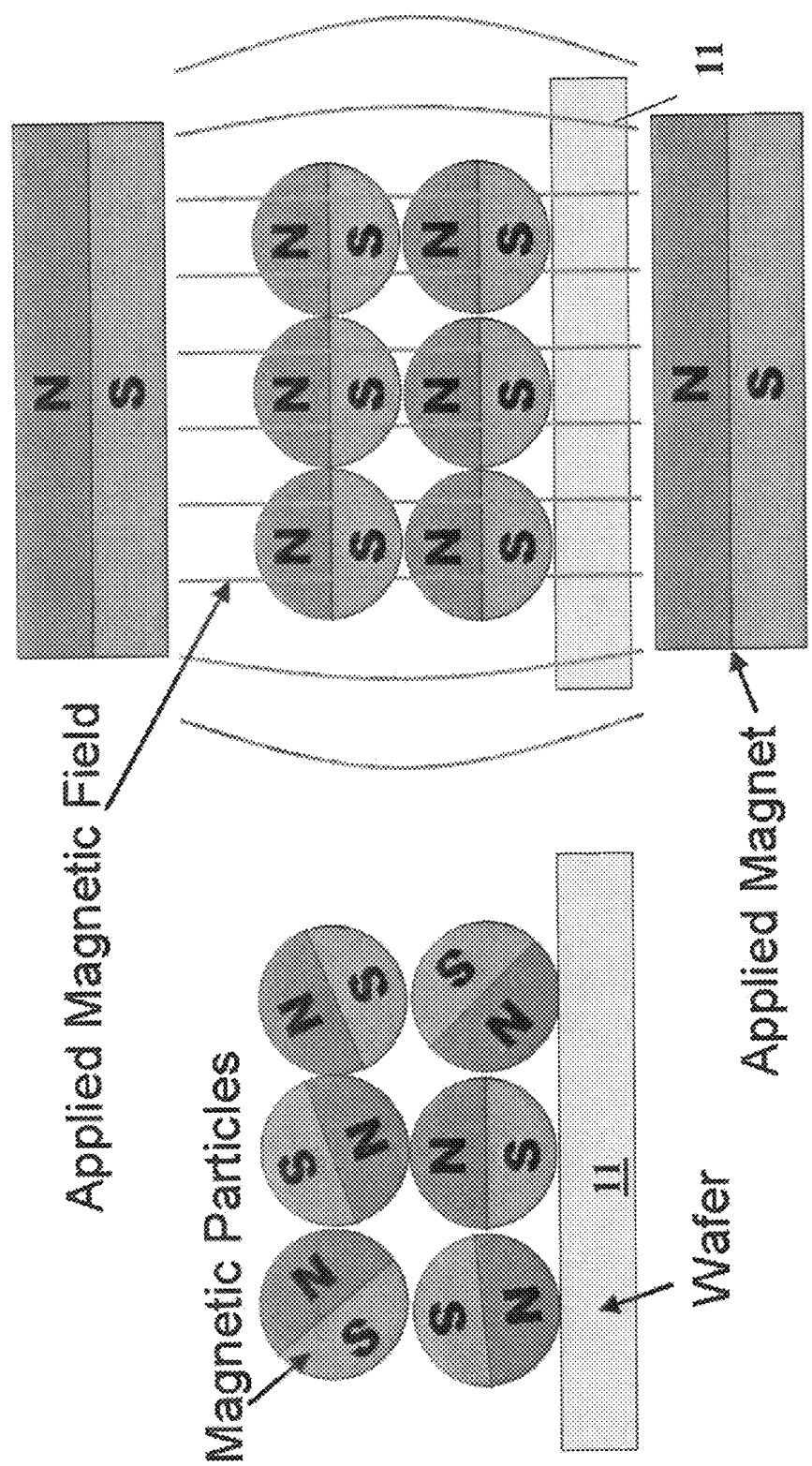
FIG. 22B is a schematic illustration depicting the effect of a magnetic field that causes an alignment of the nanoparticles.

Both channels (one dosed with and one dosed without the presence of a magnetic field) were sectioned from the wafer using a dicing saw. Magnetization measurements (by an Alternating Gradient Magnetometer) for each channel were taken both in the direction along the channel length (x-axis) and in a direction perpendicular to the channel length (z-axis). The magnetization curves of both channels are shown in FIG. 22A with orientations illustrated in the inset. As depicted in FIGS. 22A & 22B, well and capillary structures were dosed with the magnetic nanoparticles suspension with and without the presence of a permanent magnetic field during the filling of the capillary 20. Magnetization measurements show a difference in relative permeabilities of approximately 4.2 and 3.3 with and without the presence of the magnetic field, respectively. The alignment of the field during the magnetization measurements are indicated in FIG. 22A. The M-H curves are scaled by both the measured volumes of the wicked nanoparticles and the powder bulk density, $\rho_{powd}$=0.89 $g/cm^3$, provided by the manufacturer, then normalized to the saturation magnetization, $M_s$=37.7 emu/g, also provided by the manufacturer. Assuming a particle mass density of $\rho_{part}$=5.37 $g/cm^3$, a volumetric packing density of 0.18 and 0.13 was extracted for the x-aligned and z-aligned measurements, respectively. For the channel dosed in the presence of a magnetic field, a volumetric packing density of 0.24 and 0.17, respectively, was extracted. These volumetric packing densities compare well with the bulk powder packing densities of $\rho_{powd}/\rho_{part}$=0.17 as provided by the nanoparticle manufacturer. For the channel with nanoparticles delivered without the presence of the magnetic field, a slight anisotropy was observed along the channel length. There is a tendency for the magnetic nanoparticles to align such that the permeability along the channel length (x-direction) is larger than the permeability observed in the direction orthogonal to the channel length (z-direction). Relative permeabilities, $\mu_r$, of 3.3 and 2.3 for the x-directed and z-directed magnetization test fields, respectively, were extracted from the measurements. Improvements in the extracted permeabilities were measured for the channel dosed in the presence of a magnetic field. For the x-directed measurements, a $\mu_r$ of 4.2 was measured while $\mu_r$=3.3 was extracted for the z-directed measurements. The alignment of the magnetic dipoles were observed to improve because of the externally applied magnetic field during the fabrication.

A preferred embodiment incorporates a materials deposition technology developed in conjunction with a multilayer, thick-film metallization process to enable the integration of nickel ferrite ($NiFe_2O_4$) nanoparticles into micromachined inductors in a single fabrication step. Assembly of materials could be used to fill straight, single-ended capillaries with polymers as described in the publication S S. Bedair and G. K. Fedder, "Picogram Material Dosing of Microstructures," *Journal of Applied Physics*, vol. 106, 2006 (hereby incorporated by reference), and magnetic nanoparticles (as described in S. S. Bedair, et al., "Magnetic Nanoparticle Dosing of MEMS Structures by Evaporation in Capillaries," IEEE TMAG) via a well-capillary solution delivery system. The principles of the present invention include the application of this technology to fabricate closed, soft magnetic cores around transmission line inductors for applications such as power systems-on-a-chip. Significant advancements to the technology include (1) the deposition of materials to fully encapsulate structures (2) within complex, three-dimensional molds with (3) a scaling up of the fill volume by an order of magnitude over previous works for (4) integrating magnetic materials into inductor cores for up to 44% improvement in inductance. It is important to note that the generality of the method could further allow the filling of arbitrarily complex structures with any choice of nanoparticulate materials for various applications in sensing and actuation.

FIG. 23A illustrates a preferred embodiment of the present invention comprising a straight channel or capillary having walls 105 and a target well 10 for suspension delivery. FIG. 23B is a depiction of the capillary cross section B-B' during material deposition. FIG. 23B is a cross sectional view taken from the line B-B' of FIG. 23A illustrating the suspension and material solidification at times $t_1$, $t_2$ and $t_3$. The suspension exists in the channel formed by walls 105 at time $t_1$. At time $t_2$ the particles begin to solidify at a point farthest from well 10 and proceeds in the "–x" direction towards the well, such that at time $t_3$, the substantially the entire cross section has solidified. FIG. 23C illustrates a preferred embodiment of the present invention comprising a well target 10 for suspension delivery and a ring-shaped capillary having walls 105 (which could be, for example, approximately 40 μm tall) for delivery of a magnetic composite for fabrication of a closed core inductor. A suspended conductor 142 (suspended on supports 142s) becomes embedded upon material deposition (not shown) between capillary walls 105 in the manner described in the foregoing. FIG. 23 D illustrates an enlargement of FIG. 23C depicting fabrication of a closed core inductor.

A preferred method includes enhanced solvent evaporation out of the small dimensions of a capillary resulting in wicking of material from an attached well 10 containing a suspension of nanoparticles. Solidification of the particles occurs in the capillary from the channel end towards the well (as illustrated in FIG. 23B) as the solvent evaporates. See, for example, S S. Bedair and G. K. Fedder, "Picogram Material Dosing of Microstructures," *Journal of Applied Physics*, vol. 106, 2006, hereby incorporated by reference. This work leverages the flexibility of a multilayer, electroplated copper metallization process to shape the attached capillary such that the deposited material fully encapsulates a copper trace, forming a closed-magnetic-core inductor.

The fabricated, ring-shaped, transmission-line inductor structure consists, as shown in FIG. 24A, of three concentric copper traces. The inner and the outer traces function structurally to form the capillary walls 105 (which could be, for example, copper approximately 40 μm tall), while the middle functions electrically as the inductive element. The electrically inductive element 142 may be suspended Cu 30-μm-wide and 10-μm-thick, propped up 10 μm above the surface of the wafer by periodic, intermittent support posts 142S, as illustrated in the cross sections of FIG. 24C.

A solution of isopropyl alcohol, n-butanol, diacetone alcohol, and Butvar B-79 poly(vinyl butyral) was mixed with 30 nm $NiFe_2O_4$ nanoparticles. This suspension was dropped by handheld syringe into the wells, where capillary forces wicked the solution into the channels. FIG. 25 is an illustration of the solidification in the capillary beginning with the accumulation of nanoparticles in the region of the ring farthest from the well. When the concentration of particles at that far position reached a critical density, formation of the solid began. Solidification fronts marked the transition from liquid to solid, and these fronts progressed symmetrically along the two capillary branches leading towards the well.

Figure 26:
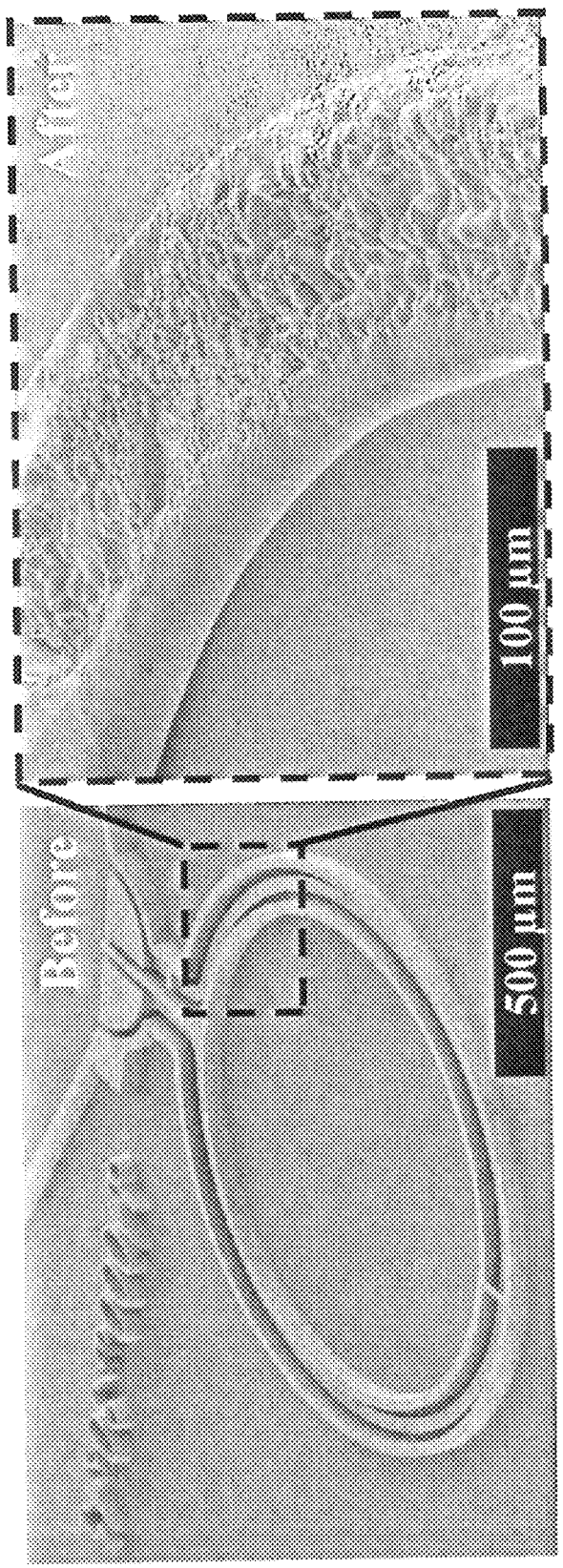
FIG. 26 illustrates a topside SEM view of copper structure before (left) and after (right) deposition of magnetic nanoparticles fully surrounding a suspended copper trace 142 showing the magnetic material was well confined within the channel and had been filled up to the top of the structure.
Figure 28A:
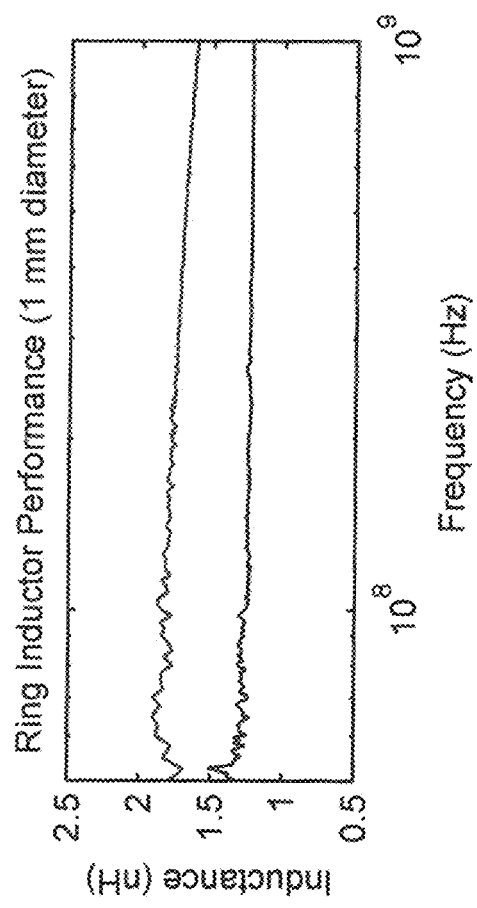
FIG. 28A is a graphical illustration showing inductance vs. frequency measured before (lower line) and after (upper line) deposition of magnetic core.
Figure 28B:
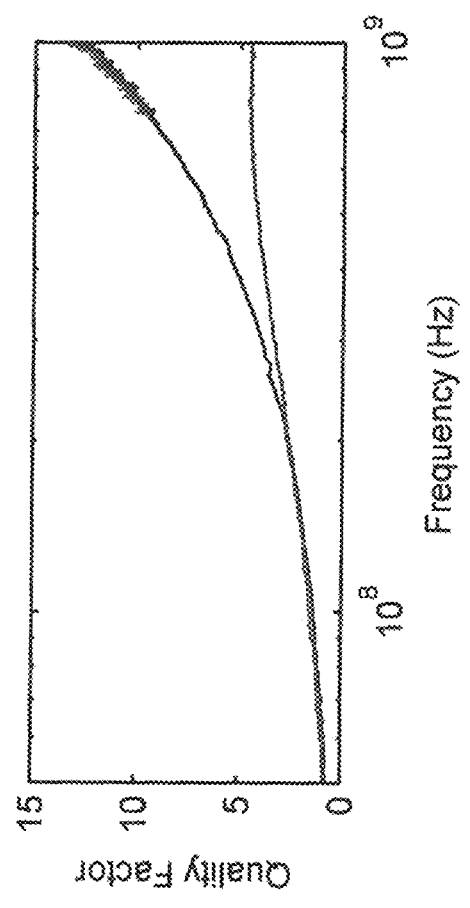
FIG. 28B is a graphical illustration showing the quality factor of ring structure versus frequency measured before (upper curved line) and after (lower, less sloped line) deposition of magnetic core.

SEM images of the structure before and after material deposition showed (FIG. 26) that the magnetic material was well confined within the channel and had been filled up to the top of the structure. Deposition of the particles was found to occur fully around the inductor line, as evidenced by the view in FIG. 27 through the backside of the clear Pyrex wafer. The measured plots in FIG. 28A showed that deposition of the magnetic core yielded a 44% improvement in inductance from the air core case of 1.25 nH to 1.80 nH with only slight roll-off past 300 MHz and with no detriment to the quality factor up to 225 MHz. Such inductance improvement is similar to other results of non-annealed, screen-printed ferrites, which require more fabrication steps than the current technique for full encapsulation of the inductor. The flexibility of this process also allows for CMOS-compatible, co-integration of high-x-dielectric capacitors to realize power systems-on-a-chip.

In a power converter, the role of a switched inductor is to store energy magnetically in its core and then deliver this energy electrically to a load. The quality factor of an inductor, a measure of how well it stores versus dissipates energy, given by Q=ωL/R, indicates that optimum efficiency can be achieved by increasing the operating frequency ω and inductance L, while decreasing resistance R. The resistive term includes the electrical resistance of the conductor and magnetic core losses.

Typically, high permeability cores have been implemented to drastically increase inductance. However, some problems in producing microfabricated, cored inductors have included high processing temperature, core losses that increase rapidly with frequency, and permeabilities that degrade at higher frequencies. In high-frequency applications, air core inductors may have an advantage in terms of cost, fabrication simplicity, weight, and power loss over traditional high permeability core inductors.

High Frequency Magnetic Materials

To temporarily store and redeliver energy in a scaled inductor volume, high power densities and low material losses are needed. The ideal, inductor magnetic material would exhibit high relative permeability (μr), and high saturation magnetization (Bsat), to enable the most energy storage; and likewise low coercivity (Hc), low electrical conductivity (σ), and zero magnetostriction (SM) to minimize losses. Additionally, the material should possess a high thermal conductivity, κ, to help dissipate any heat and thermal expansion coefficient close to silicon to mitigate thermally induced stresses. Unfortunately, the materials with the highest Bsat and μr, metal alloy based ferromagnetics, have high electrical conductivities and thus suffer from large eddy current losses at high frequencies. Oxide materials on the other hand, which are highly electrically resistive have only moderate Bsat and μr values, and low thermal conductivity.

At higher frequencies, the dominant source of power loss in an inductor is from eddy currents within the ferromagnetic structure. While laminate structures, where oxide layers are interposed between the electrodes and the ferromagnetic layer have succeeded in minimizing the eddy currents and resistive losses in the z-direction, substantial in-plane losses due to the eddy currents persist. Thus, existing materials are insufficient for high frequency applications. In addition, there are a number of obstacles that must be overcome to achieve a fully integrated device. While iron based metals are well understood, in order to achieve a realizable device, a number of layers of iron-based metal must be integrated with electrode materials, and an insulator to minimize the eddy currents. All of these material deposition steps need to be accomplished, eventually, in a manner that is CMOS compatible. The most challenging restriction, of which, is the upper temperature limit of 400° C., as ferromagnetic materials frequently require post-deposition annealing to maximize properties.

A generic magnetic material deposition method has been shown. This deposition technology may be extended to applications where dosing of MEMS structures with magnetic and/or pyrotechnic materials is needed such as pyrotechnic devices, magnetic sensor applications or vibration harvesting. It is important to note that this method can deliver a wide variety of magnetic and/or pyrotechnic materials, in addition to other materials, in an inexpensive manner onto a single surface. This enables a rapid, low cost multi-material deposition technique as an alternate to traditional micro-fabrication techniques.

The above descriptions illustrate that there are a wide variety of constructs to achieve, for example, passives integration using the embodiments herein. The only requirements are a well and channel platform. Accordingly, the embodiments herein provide a technique to make customized integrated passives and not just simply passive constructs.

The principles of the present invention are not limited to passive devices or constructs. Other examples include pyrotechnics, fuzes, thermoelectrics, resistors, piezo-electrics and sensors.

As used herein, the terminology "capillary action" means the movement of a liquid along the surface of a solid caused by the attraction of molecules of the liquid to the molecules of the solid, and in the case of a capillary, the drawing of a liquid into the capillary when adhesive forces exceed cohesive forces capillary action is one manifestation of surface tension.

As used herein, the terminology meso-scale refers to 1 mm scale objects (generally having dimensions in the range of approximately 1 to 100 mm).

As used herein the terminology "mm-scale" relates to objects within the millimeter scale (generally having dimensions in the range of approximately 1 to 100 millimeters).

As used herein the terminology μm-sized or "micron-sized" structures means structures means structures or objects generally having dimensions in the range of approximately 1 micron (μm) ($10^{-6}$ m) to 100 microns ($100 \times 10^{-6}$ meters).

As used herein, the terminology "microelectronic device" means an electronic device having a micron-sized structure.

As used herein the terminology "sub-micron-scale" refers to objects generally having dimensions in the range of approximately $10^{-9}$ m (one nanometer) to 1 micrometer ($10^{-6}$ m) and relates to structure and behavior that is larger than the molecular scale or atomistic scale (angstroms scale, $10^{-10}$ m).

The terminology nanoscale means structure having dimensions generally within the range of approximately 1 to 100 nanometers.

The terminology "nanosized" means generally on the order of nanometers ($10^{-9}$ meters) in multiple directions.

The terminology "nanomaterials" or nano-particles means materials or particles generally having dimensions generally in the range of approximately 1-100 nm.

As used herein the terminology capillary means a small channel where capillary forces are effective.

As used herein, the terminology solvent is a liquid that can contain particles in a liquid suspension.

As used herein the terminology "direct integration" in relation to fabrication means, a fabrication process which manifests physical parts directly using additive fabrication techniques onto a substrate containing integrated circuitry. The various components, such as, for example, an inductor, are formed on the substrate of the integrated circuit. The direct integration fabrication process is in contrast to thin film flip-chip bonding which utilizes solder connections.

As used herein, the terminology "temperature sensitive devices" means devices which temperatures cannot exceed the upper temperature limit of 400° C.

As used herein the terminology suspension wicking correlates to capillary action.

As used herein, the terminology "critical density" means the state of the concentration of particles where the formation of the solid begins.

As used herein, the terminology "wafer" means a thin slice of material, such as a silicon crystal, used in the fabrication of integrated circuits and other microdevices which serves as the substrate for microelectronic devices built in and/or over the wafer.

As used herein, the terminology "spiral" means a curve on a plane that winds around a fixed center point at a continuously increasing or decreasing distance from the point.

As used herein, the terminology "hysterisis" refers to the hysteresis phenomena occurring in, for example, magnetic materials, ferromagnetic materials and ferroelectric materials, in which a lag time occurs between the application and the removal of a force or field and its subsequent effect. Hysterisis may be depicted by a ferromagnetic hysteresis loop graphically illustrating that the relationship between magnetic field strength (H) and magnetic flux density (B) is not linear in such materials. As used herein the $B_s$ or $B_{sat}$ is the saturation point of the magnetic flux density.

As used herein, the terminology "fuze" means readily combustible material that is lighted at one end to carry a flame along its length to detonate an explosive at the other end.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A microelectronic integrated circuit device comprising:
a substrate;
at least one depository coupled to said substrate, the at least one depository being formed by at least one wall adjacent to the substrate;
at least one capillary channel coupled to at least one depository, the at least one capillary channel formed by at least one wall adapted to be filled with a liquid comprising nanoparticles from the at least one depository by capillary action; the at least one wall having at least one opening exposed to an ambient environment along at least a portion of the channel to permit evaporation such that as the liquid evaporates, a liquid/material solidification interface starts with an accumulation of solidification at the point farthest from the well and progresses towards the entrance thereby forming agglomerate in the capillary channel having a substantially uniform distribution of the particles within the agglomerate and substantially void-free;
and wherein the temperature remains below 400° C. during the formation of the agglomerate.

2. The device of claim 1 wherein the at least one capillary channel is adapted to be filled with a liquid containing nanoparticles that is one of an exothermic reactant or a pyrotechnic mixture, such that the agglomerate is an exothermic reactant or a pyrotechnic mixture and wherein the width of the at least one capillary is the same or smaller than the diameter of the meniscus of the liquid, and wherein the capillary action has a pumping effect which drives the pyrotechnic nanoparticles to the end of the at least one capillary and the solidification occurs first at the end of the at least one capillary and proceeds progressively towards the beginning of the at least one capillary.

3. The device of claim 1 wherein the at least one capillary forms part of a channel having an embedded hot wire bridge connected to traces that are adapted to provide a hot spot to initiate a self-sustaining reaction.

4. The device of claim 1 wherein the at least one capillary comprises at least one spiraled capillary channel adapted to be filled with a pyrotechnic mixture.

5. The device of claim 1 wherein the at least one capillary forms a micro-scale firetrain for micro electromechanical system (MEMS) fuzing for weapons.

6. The device of claim 1 wherein the at least one capillary channel is adapted to be filled with nanoparticles comprising solder nanoparticles mixed to provide self heating solder once a reaction is initiated.

7. The device of claim 1 wherein the at least one capillary is adapted to be filled with liquid and nanoparticles comprising exothermal reactants that act as a fuze and wherein the width of the at least one capillary is the same or smaller than the diameter of the meniscus of the liquid, and wherein the capillary action has a pumping effect which drives the pyrotechnic nanoparticles to the end of the at least one capillary and the solidification occurs first at the end of the at least one capillary and proceeds progressively towards the beginning of the at least one capillary.

8. A microelectronic integrated circuit device comprising:
a substrate;
at least one depository coupled to said substrate, the at least one depository being formed by at least one wall adjacent to the substrate;
means for forming a substantially void free agglomerate comprising at least one capillary channel coupled to at least one depository, the at least one capillary channel formed by at least one wall adapted to be filled with a liquid comprising nanoparticles from the at least one depository by capillary action; the at least one wall having at least one opening exposed to an ambient environment along at least a portion of the channel to permit evaporation such that as the liquid evaporates, a liquid/material solidification interface starts with an accumulation of solidification at the point farthest from the well and progresses towards the entrance thereby forming agglomerate in the capillary channel having a substantially uniform distribution of the particles within the agglomerate and substantially void-free;
and wherein the temperature remains below 400° C. during the formation of the agglomerate.

9. The device of claim 8 wherein the at least one capillary channel is adapted to be filled with a liquid containing nanoparticles that is one of an exothermic reactant or a pyrotechnic mixture, such that the agglomerate is an exothermic reactant or a pyrotechnic mixture.

10. The device of claim 8 wherein the at least one capillary channel forms part of a channel having an embedded hot wire bridge connected to traces that are adapted to provide a hot spot to initiate a self-sustaining reaction.

11. The device of claim 8 wherein the at least one capillary channel comprises at least one spiraled capillary channel adapted to be filled with a pyrotechnic mixture.

12. The device of claim 8 wherein the at least one capillary channel forms a micro-scale firetrain for micro electromechanical system (MEMS) fuzing for weapons.

13. The device of claim 8 wherein the at least one capillary channel is adapted to be filled with nanoparticles comprising solder nanoparticles mixed to provide self heating solder once a reaction is initiated.

14. The device of claim 8 wherein the at least one capillary channel is adapted to be filled with liquid and nanoparticles comprising exothermal reactants that act as a fuze.

15. A microelectronic integrated circuit device comprising:
a substrate;
at least one depository coupled to said substrate, the at least one depository being formed by at least one wall adjacent to the substrate;
at least one capillary channel coupled to at least one depository, the at least one capillary channel forming a micro-scale firetrain for micro electromechanical system (MEMS) fuzing for weapons; the at least one capillary channel formed by walls filled with a liquid comprising nanoparticles from the at least one depository by capillary action; such that as the liquid evaporates, a liquid/material solidification interface starts with an accumulation of solidification at the point farthest from the well and progresses towards the entrance thereby forming agglomerate in the capillary channel having a substantially uniform distribution of the particles within the agglomerate and substantially void-free;
and wherein the temperature remains below 400° C. during the formation of the agglomerate.

16. The device of claim 15 wherein the at least one capillary forms part of a channel having an embedded hot wire bridge connected to traces that are adapted to provide a hot spot to initiate a self-sustaining reaction.

17. The device of claim 15 wherein the at least one capillary comprises at least one spiraled capillary channel adapted to be filled with a pyrotechnic mixture.

* * * * *